(12) United States Patent
Claussen et al.

(10) Patent No.: US 11,121,528 B2
(45) Date of Patent: Sep. 14, 2021

(54) MODULAR COMMUNICATIONS EQUIPMENT SUPPORT

(71) Applicant: Charter Communications Operating, LLC, St. Louis, MO (US)

(72) Inventors: David Claussen, Evergreen, CO (US); Roger Stafford, Thornton, CO (US); Kevin Kwasny, Denver, CO (US)

(73) Assignee: CHARTER COMMUNICATIONS OPERATING, LLC, St. Louis, MO (US)

( * ) Notice: Subject to any disclaimer, the term of this patent is extended or adjusted under 35 U.S.C. 154(b) by 233 days.

(21) Appl. No.: 16/419,644

(22) Filed: May 22, 2019

(65) Prior Publication Data

US 2019/0363523 A1 Nov. 28, 2019

Related U.S. Application Data

(60) Provisional application No. 62/674,976, filed on May 22, 2018.

(51) Int. Cl.
*H04Q 1/02* (2006.01)
*H05K 7/20* (2006.01)
(Continued)

(52) U.S. Cl.
CPC ............... *H02B 1/305* (2013.01); *H02B 1/28* (2013.01); *H02B 1/32* (2013.01); *H02B 1/48* (2013.01);
(Continued)

(58) Field of Classification Search
CPC ............... H05K 5/0008; H05K 5/0247; H05K 7/02336; H05K 7/20409; H02G 3/088; H04Q 1/035; H04Q 1/09; H04Q 1/025
See application file for complete search history.

(56) References Cited

U.S. PATENT DOCUMENTS 3,359,460 A * 12/1967 Ragone ................... H03H 7/482
361/679.01
3,997,819 A * 12/1976 Eggert ..................... H05K 5/06
361/704
(Continued)

OTHER PUBLICATIONS

Cisco, 1 GHz GainMaker Broadband Amplifier Platform Line Extender Modules and Housings Installation and Operation Guide, © 2007, 2014 Cisco Systems, Inc., pp. i-xiii and 1-115.
(Continued)

*Primary Examiner* — Robert J Hoffberg
(74) *Attorney, Agent, or Firm* — Otterstedt, Wallace & Kammer, LLP

(57) ABSTRACT

An assembly includes a ring frame having first and second open sides and an electrical connector block; a mounting structure to which the ring frame is secured; a plurality of power and signal cable connection points defined on the ring frame; and a plurality of power and signal cables coupled to the power and signal cable connection points and the connector block. First and second covers are secured to the ring frame. Each of the first and second covers is open on one side facing the ring frame and defines a mounting cavity. A plurality of heat-dissipating electronic components are mechanically and thermally coupled to the first and second covers and located in the mounting cavities. The heat-dissipating electronic components are releasably electrically coupled to the electrical connector block.

27 Claims, 14 Drawing Sheets

(51) Int. Cl.
*H05K 5/02* (2006.01)
*H02B 1/30* (2006.01)
*H02B 1/48* (2006.01)
*H02B 1/28* (2006.01)
*H02B 1/32* (2006.01)
*H04L 12/28* (2006.01)
*H05K 5/00* (2006.01)
*H02G 3/08* (2006.01)

(52) U.S. Cl.
CPC ......... *H02G 3/088* (2013.01); *H04L 12/2801* (2013.01); *H04Q 1/035* (2013.01); *H04Q 1/09* (2013.01); *H05K 5/0008* (2013.01); *H05K 5/0247* (2013.01); *H05K 7/20336* (2013.01); *H05K 7/20409* (2013.01)

(56) References Cited

U.S. PATENT DOCUMENTS

| | | | | |
|---|---|---|---|---|
| 5,065,278 A | * | 11/1991 | Schultz | H05K 7/209 361/688 |
| 5,267,122 A | * | 11/1993 | Glover | G02B 6/3897 174/50.51 |
| 5,828,807 A | * | 10/1998 | Tucker | H04Q 1/116 385/135 |
| 5,896,268 A | * | 4/1999 | Beavers | H04Q 1/025 361/690 |
| 5,982,972 A | * | 11/1999 | Tucker | G02B 6/4441 385/135 |
| 6,035,032 A | * | 3/2000 | Daoud | H04Q 1/021 379/325 |
| 6,065,975 A | * | 5/2000 | Daoud | H01R 9/24 439/49 |
| 6,133,939 A | * | 10/2000 | Gresko | H04N 7/104 725/127 |
| 6,157,715 A | * | 12/2000 | Daoud | H04Q 1/028 220/4.02 |
| 6,354,461 B1 | * | 3/2002 | Tenney | E05D 7/1044 16/257 |
| 6,396,691 B1 | * | 5/2002 | Pagnozzi | H05K 7/20445 174/17.05 |
| 6,411,515 B1 | * | 6/2002 | Sakamoto | H04B 1/74 165/185 |
| 6,587,339 B1 | * | 7/2003 | Daniels | H05K 7/20445 361/690 |
| 6,781,830 B2 | * | 8/2004 | Barth | H05K 7/20445 165/185 |
| 6,785,138 B1 | * | 8/2004 | Rapey | H04L 25/20 361/690 |
| 7,086,078 B1 | * | 8/2006 | Gresko | H01R 24/547 725/127 |
| 7,792,963 B2 | | 9/2010 | Gould | |
| 9,301,024 B2 | * | 3/2016 | Cook | H04Q 1/02 |
| 10,784,664 B2 | * | 9/2020 | Mahoney | H05K 5/02 |
| 10,931,039 B2 | * | 2/2021 | Mahoney | H05K 5/0021 |
| 2003/0056217 A1 | | 3/2003 | Brooks | |
| 2004/0123998 A1 | | 7/2004 | Berglund et al. | |
| 2006/0130107 A1 | | 6/2006 | Gonder et al. | |
| 2007/0217436 A1 | | 9/2007 | Markley | |
| 2009/0248794 A1 | | 10/2009 | Helms | |
| 2010/0313236 A1 | | 12/2010 | Straub | |
| 2012/0279745 A1 | | 11/2012 | Badura et al. | |
| 2014/0226945 A1 | | 8/2014 | Claessens et al. | |
| 2015/0052573 A1 | | 2/2015 | Schemmann et al. | |
| 2015/0109710 A1 | | 4/2015 | Politis et al. | |
| 2016/0043806 A1 | | 2/2016 | Maricevic et al. | |
| 2016/0285249 A1 | | 9/2016 | Zhai et al. | |
| 2017/0170790 A1 | | 6/2017 | Schemmann et al. | |

OTHER PUBLICATIONS

Arris, Fiber-Deep DOCSIS® 3.1 Node Segmentation, Optical Node Series NC4000S2 4×4 Fully Segmentable 1 GHz Node pp. 1-3 Mar. 2016.

Arris, Fiber-Deep DOCSIS® 3.1 Node Segmentation, Optical Node Series NC4000S3 4×4 Fully Segmentable 1 GHz Node pp. 1-3 Mar. 2016.

Arris, Fiber-Deep DOCSIS® 3.1 Node Segmentation, Optical Node Series TR4440B-xxxx-PI CWDM Optical Transceiver Module (SFP) pp. 1-3 Mar. 2016.

* cited by examiner

MODULAR COMMUNICATIONS EQUIPMENT SUPPORT

CROSS REFERENCE TO RELATED APPLICATIONS

This application claims the benefit of U.S. Provisional Application Ser. No. 62/674,976, "MODULAR COMMUNICATIONS EQUIPMENT SUPPORT," filed on 22 May 2018, the complete disclosure of which is expressly incorporated herein by reference in its entirety for all purposes.

FIELD OF THE INVENTION

The present invention relates generally to the electrical, electronic, and computer arts, and more particularly relates to node housings in broadband networks and the like.

BACKGROUND OF THE INVENTION

Cable television is a system of delivering television programming to paying subscribers via radio frequency (RF) signals transmitted through coaxial cables, or in more recent systems, light pulses through fiber-optic cables. Historically, the cable network was predominantly a vehicle for delivering entertainment. With the advent of the Internet and the rise in demand for broadband two-way access, the cable industry began to seek new ways of utilizing its existing plant. Pure coaxial ("coax") cable networks were replaced with hybrid fiber/coax networks (HFCs) using optical fiber from the head end to the demarcation with the subscriber coax (usually at a fiber node). Currently, a content-based network, a non-limiting example of which is a cable television network, may afford access to a variety of services including television, broadband Internet access, telephone service, and the like. There are also fiber networks for fiber to the home (FTTH) deployments (also known as fiber to the premises or FTTP.

One significant issue for a cable operator desiring to provide digital service is the configuration of its network. Designed for one-way delivery of broadcast signals, the existing cable network topology was optimized for downstream only (i.e., towards the subscriber) service. New equipment had to be added to the network to provide two-way communication. To reduce the cost of this equipment and to simplify the upgrade of the broadcast cable for two-way digital traffic, standards were developed for a variety of new cable-based services. The first of these standards, the Data Over Cable System Interface Standard (DOCSIS® standard), was released in 1998. DOCSIS® establishes standards for cable modems and supporting equipment. DOCSIS® (Data Over Cable Service Interface Specification) is a registered mark of Cable Television Laboratories, Inc., 400 Centennial Parkway Louisville Colo. 80027, USA, and may be referred to at some points herein in capital letters, without the ® symbol, for convenience.

There are many types of IP networks besides cable networks. Other wired IP networks include, for example, digital subscriber line (DSL), fiber to the home, fiber to the curb, and so on. Wireless IP networks include Wi-Fi, wireless ISP (Internet Service Provider), WiMAX, satellite internet, and mobile broadband.

Part of the physical plant of a cable or fiber optic network, or other video content network, is the so-called node housing, which typically hangs from a cable by the curb outside a premises or is mounted on a pedestal at the curb outside a premises. Current node housings may have issues with weight, heat dissipation, repetitive stress cycling, and/or difficulty in changing out internal components for service upgrades and the like.

SUMMARY OF THE INVENTION

Techniques are provided for a modular communications equipment support.

In one aspect, an exemplary assembly includes a ring frame having first and second open sides and an electrical connector block; a mounting structure to which the ring frame is secured; a plurality of power and signal cable connection points defined on the ring frame; and a plurality of power and signal cables coupled to the power and signal cable connection points and the connector block. First and second covers are secured to the ring frame. Each of the first and second covers is open on one side facing the ring frame and defining a mounting cavity. A plurality of heat-dissipating electronic components are mechanically and thermally coupled to the first and second covers and located in the mounting cavities. The heat-dissipating electronic components are releasable electrically coupled to the electrical connector block.

In another aspect, another exemplary electronic component housing apparatus includes a ring frame having first and second open sides and an electrical connector block; at least one mount configured to attach the ring frame to an external mounting element; a plurality of power and signal cable connection points defined on the ring frame; and first and second covers securable to the ring frame. Each of the first and second covers is open on one side facing the ring frame and defining a mounting cavity. A plurality of heat-dissipating electronic components are mechanically and thermally coupled to the first and second covers and located in the mounting cavities. the heat-dissipating electronic components are releasable electrically coupled to the electrical connector block.

In still another aspect, an exemplary method includes securing a ring frame to a mounting structure. The ring frame has first and second open sides and has a plurality of power and signal cable connection points defined thereon. The ring frame has an electrical connector block. The method further includes coupling a plurality of power and signal cables to the power and signal cable connection points and the electrical connector block; and providing first and second covers for the ring frame. Each of the first and second covers is open on one side facing the ring frame and defining a mounting cavity. The method still further includes mechanically and thermally coupling a plurality of heat-dissipating electronic components to the first and second covers in the mounting cavities; releasably electrically coupling the heat-dissipating electronic components to the electrical connector block; and securing the first and second covers to the ring frame.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments provide:

reduced fatigue cycling,
easier configuration changes/upgrades,
simplified operational aspects pertaining to maintenance and or technological update on a node,
faster deployment and implementation,
ability to better maintain the integrity of physical plant,
enhanced cable management and installation capability,
re-use of housings, allowing for retention of capital instead of scrapping current housings, because embodiments provide options to exchange covers with new contents,
modular approach that can accommodate many different types of nodes as the number of types of nodes expands, and/or
enhanced thermal control.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
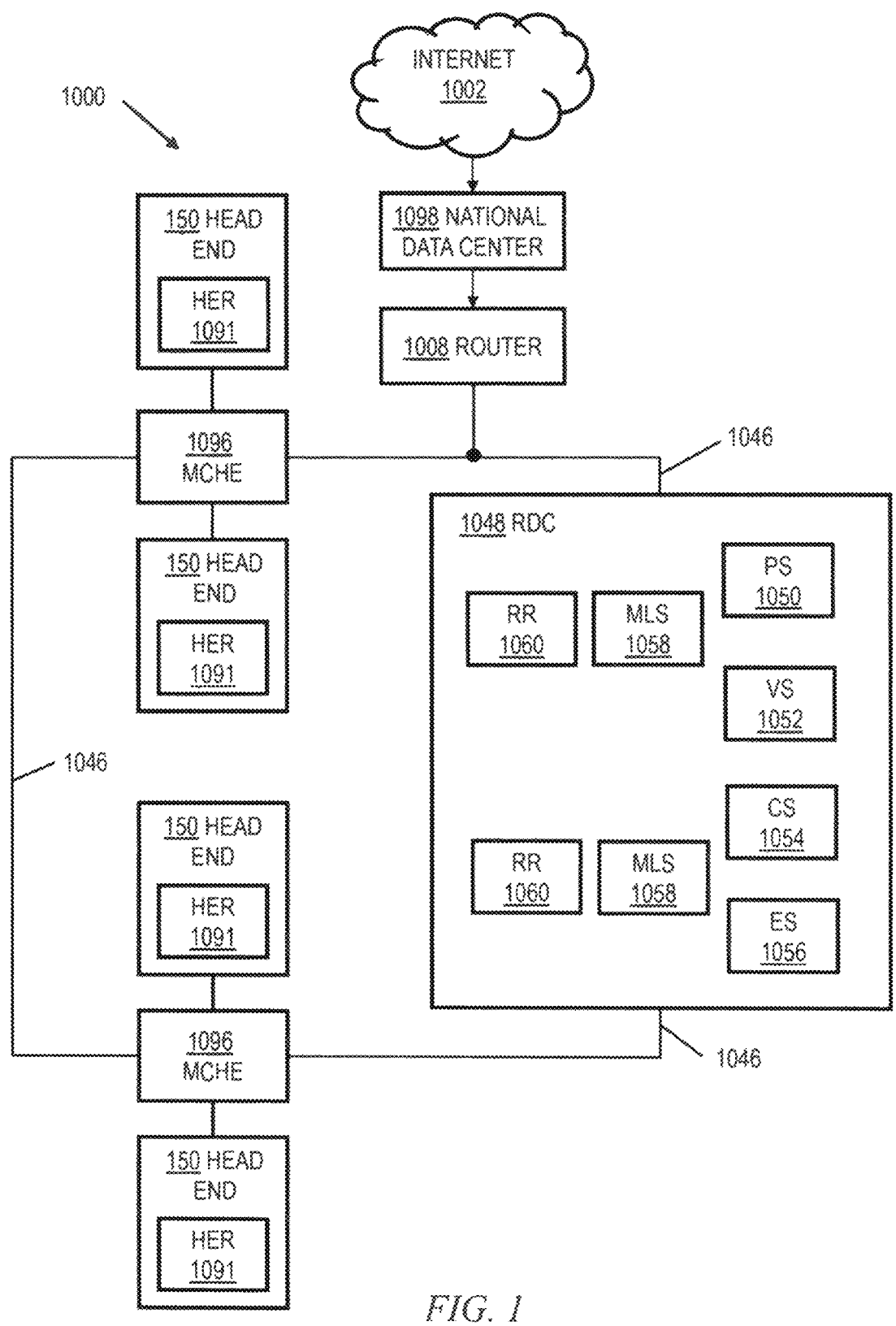
FIG. 1 is a block diagram of an exemplary embodiment of a system, within which one or more aspects of the invention can be implemented.

Purely by way of example and not limitation, some embodiments will be shown in the context of the physical plant of a cable multi-service operator (MSO) providing data services as well as entertainment services. FIG. 1 shows an exemplary system 1000, according to an aspect of the invention. System 1000 includes a regional data center (RDC) 1048 coupled to several Market Center Head Ends (MCHEs) 1096; each MCHE 1096 is in turn coupled to one or more divisions, represented by division head ends 150. In a non-limiting example, the MCHEs are coupled to the RDC 1048 via a network of switches and routers. One suitable example of network 1046 is a dense wavelength division multiplex (DWDM) network. The MCHEs can be employed, for example, for large metropolitan area(s). In addition, the MCHE is connected to localized HEs 150 via high-speed routers 1091 ("HER"=head end router) and a suitable network, which could, for example, also utilize DWDM technology. Elements 1048, 1096 on network 1046 may be operated, for example, by or on behalf of a cable MSO, and may be interconnected with a global system of interconnected computer networks that use the standardized Internet Protocol Suite (TCP/IP)(transfer control protocol/Internet protocol), commonly called the Internet 1002; for example, via router 1008. In one or more non-limiting exemplary embodiments, router 1008 is a point-of-presence ("POP") router; for example, of the kind available from Juniper Networks, Inc., Sunnyvale, Calif., USA.

Head end routers 1091 are omitted from figures below to avoid clutter, and not all switches, routers, etc. associated with network 1046 are shown, also to avoid clutter.

RDC 1048 may include one or more provisioning servers (PS) 1050, one or more Video Servers (VS) 1052, one or more content servers (CS) 1054, and one or more e-mail servers (ES) 1056. The same may be interconnected to one or more RDC routers (RR) 1060 by one or more multi-layer switches (MLS) 1058. RDC routers 1060 interconnect with network 1046.

A national data center (NDC) 1098 is provided in some instances; for example, between router 1008 and Internet 1002. In one or more embodiments, such an NDC may consolidate at least some functionality from head ends (local and/or market center) and/or regional data centers. For example, such an NDC might include one or more VOD servers; switched digital video (SDV) functionality; gateways to obtain content (e.g., program content) from various sources including cable feeds and/or satellite; and so on.

In some cases, there may be more than one national data center 1098 (e.g., two) to provide redundancy. There can be multiple regional data centers 1048. In some cases, MCHEs could be omitted and the local head ends 150 coupled directly to the RDC 1048.

Figure 2:
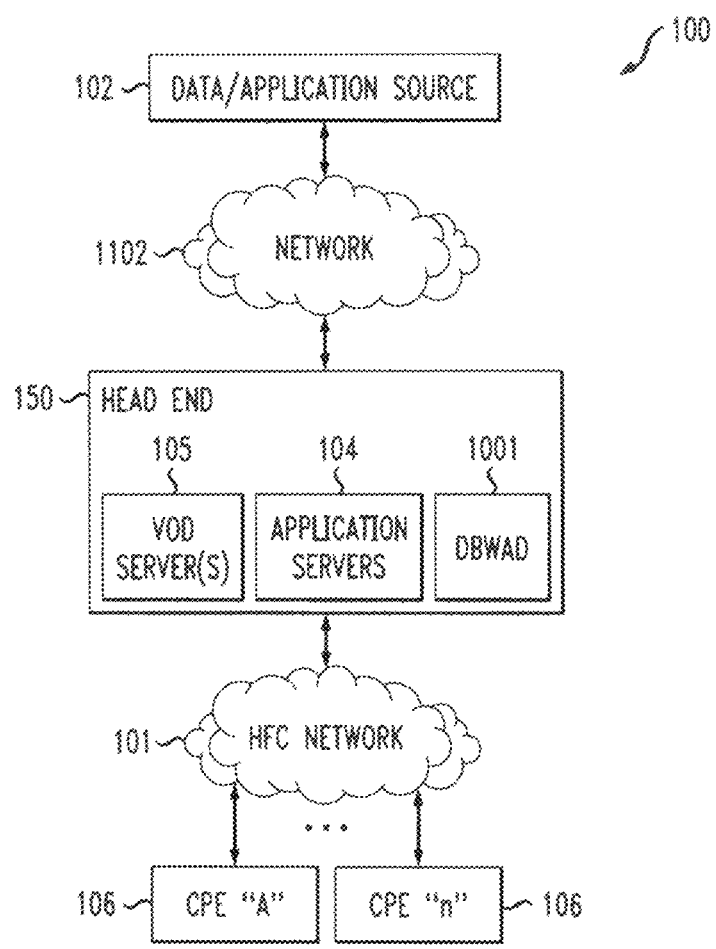
FIG. 2 is a functional block diagram illustrating an exemplary hybrid fiber-coaxial (HFC) divisional network configuration, useful within the system of FIG. 1.

FIG. 2 is a functional block diagram illustrating an exemplary content-based (e.g., hybrid fiber-coaxial (HFC)) divisional network configuration, useful within the system of FIG. 1. See, for example, US Patent Publication 2006/0130107 of Gonder et al., entitled "Method and apparatus for high bandwidth data transmission in content-based networks," the complete disclosure of which is expressly incorporated by reference herein in its entirety for all purposes. The various components of the network 100 include (i) one or more data and application origination points 102; (ii) one or more application distribution servers 104; (iii) one or more video-on-demand (VOD) servers 105, and (v) consumer premises equipment or customer premises equipment (CPE). The distribution server(s) 104, VOD servers 105 and CPE(s) 106 are connected via a bearer (e.g., HFC) network 101. Servers 104, 105 can be located in head end 150. A simple architecture is shown in FIG. 2 for illustrative brevity, although it will be recognized that comparable architectures with multiple origination points, distribution servers, VOD servers, and/or CPE devices (as well as different network topologies) may be utilized consistent with embodiments of the invention. For example, the head-end architecture of FIG. 3 (described in greater detail below) may be used.

It should be noted that the exemplary CPE 106 is an integrated solution including a cable modem (e.g., DOCSIS) and one or more wireless routers. Other embodiments could employ a two-box solution; i.e., separate cable modem and routers suitably interconnected, which nevertheless, when interconnected, can provide equivalent functionality. Furthermore, FTTH networks can employ Service ONUS (S-ONUS; ONU=optical network unit) as CPE, as discussed elsewhere herein.

The data/application origination point 102 comprises any medium that allows data and/or applications (such as a VOD-based or "Watch TV" application) to be transferred to a distribution server 104, for example, over network 1102. This can include for example a third-party data source, application vendor website, compact disk read-only memory (CD-ROM), external network interface, mass storage device (e.g., Redundant Arrays of Inexpensive Disks (RAID) system), etc. Such transference may be automatic, initiated upon the occurrence of one or more specified events (such as the receipt of a request packet or acknowledgement (ACK)), performed manually, or accomplished in any number of other modes readily recognized by those of ordinary skill, given the teachings herein. For example, in one or more embodiments, network 1102 may correspond to network 1046 of FIG. 1, and the data and application origination point may be, for example, within NDC 1098, RDC 1048, or on the Internet 1002. Head end 150, HFC network 101, and CPEs 106 thus represent the divisions which were represented by division head ends 150 in FIG. 1.

The application distribution server 104 comprises a computer system where such applications can enter the network system. Distribution servers per se are well known in the networking arts, and accordingly not described further herein.

The VOD server 105 comprises a computer system where on-demand content can be received from one or more of the aforementioned data sources 102 and enter the network system. These servers may generate the content locally, or alternatively act as a gateway or intermediary from a distant source.

The CPE 106 includes any equipment in the "customers' premises" (or other appropriate locations) that can be accessed by the relevant upstream network components. Non-limiting examples of relevant upstream network components, in the context of the HFC network, include a distribution server 104 or a cable modem termination system 156 (discussed below with regard to FIG. 3). The skilled artisan will be familiar with other relevant upstream network components for other kinds of networks (e.g. FTTH) as discussed herein. Non-limiting examples of CPE are set-top boxes, high-speed cable modems, and Advanced Wireless Gateways (AWGs) for providing high bandwidth Internet access in premises such as homes and businesses. Reference is also made to the discussion of an exemplary FTTH network in connection with FIGS. 8 and 9.

Also included (for example, in head end 150) is a dynamic bandwidth allocation device (DBWAD) 1001 such as a global session resource manager, which is itself a non-limiting example of a session resource manager.

Figure 3:
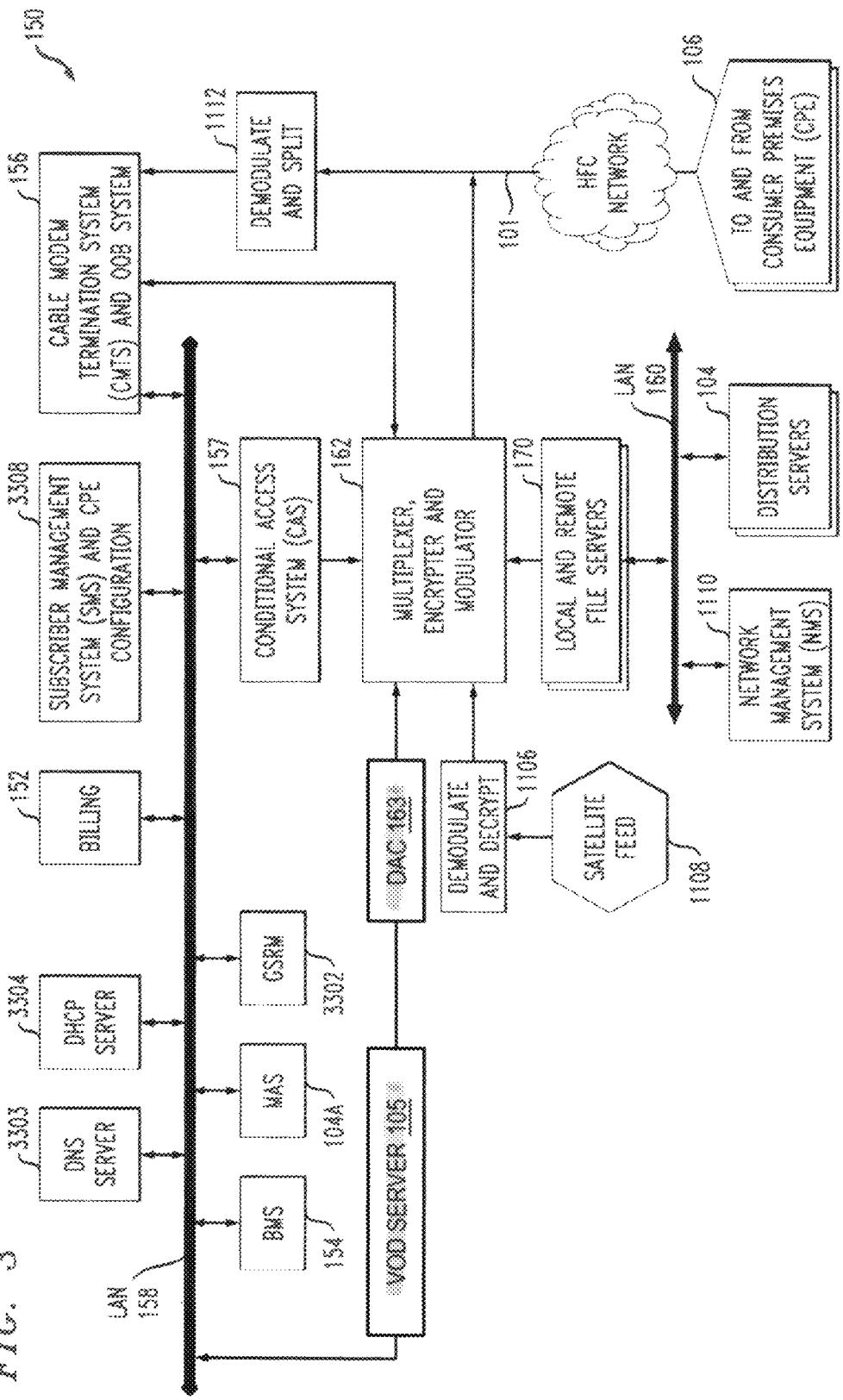
FIG. 3 is a functional block diagram illustrating one exemplary HFC cable network head-end configuration, useful within the system of FIG. 1.

FIG. 3 is a functional block diagram illustrating one exemplary HFC cable network head-end configuration, useful within the system of FIG. 1. As shown in FIG. 3, the head-end architecture 150 comprises typical head-end components and services including billing module 152, subscriber management system (SMS) and CPE configuration management module 3308, cable-modem termination system (CMTS) and out-of-band (OOB) system 156, as well as LAN(s) 158, 160 placing the various components in data communication with one another. In one or more embodiments, there are multiple CMTSs. Each may be coupled to an HER 1091, for example. See, e.g., FIGS. 1 and 2 of co-assigned U.S. Pat. No. 7,792,963 of inventors Gould and Danforth, entitled METHOD TO BLOCK UNAUTHORIZED NETWORK TRAFFIC IN A CABLE DATA NETWORK, the complete disclosure of which is expressly incorporated herein by reference in its entirety for all purposes.

It will be appreciated that while a bar or bus LAN topology is illustrated, any number of other arrangements (e.g., ring, star, etc.) may be used consistent with the invention. It will also be appreciated that the head-end configuration depicted in FIG. 3 is high-level, conceptual architecture and that each multi-service operator (MSO) may have multiple head-ends deployed using custom architectures.

The architecture 150 of FIG. 3 further includes a multiplexer/encrypter/modulator (MEM) 162 coupled to the HFC network 101 adapted to "condition" content for transmission over the network. The distribution servers 104 are coupled to the LAN 160, which provides access to the MEM 162 and network 101 via one or more file servers 170. The VOD servers 105 are coupled to the LAN 158, although other architectures may be employed (such as for example where the VOD servers are associated with a core switching device such as an 802.3z Gigabit Ethernet device; or the VOD servers could be coupled to LAN 160). Since information is typically carried across multiple channels, the head-end should be adapted to acquire the information for the carried channels from various sources. Typically, the channels being delivered from the head-end 150 to the CPE 106 ("downstream") are multiplexed together in the head-end and sent to neighborhood hubs (refer to description of FIG. 4) via a variety of interposed network components.

Content (e.g., audio, video, etc.) is provided in each downstream (in-band) channel associated with the relevant service group. (Note that in the context of data communications, internet data is passed both downstream and upstream.) To communicate with the head-end or intermediary node (e.g., hub server), the CPE 106 may use the out-of-band (OOB) or DOCSIS® (Data Over Cable Service Interface Specification) channels (registered mark of Cable Television Laboratories, Inc., 400 Centennial Parkway Louisville Colo. 80027, USA) and associated protocols (e.g., DOCSIS 1.x, 2.0. or 3.0). The OpenCable™ Application Platform (OCAP) 1.0, 2.0, 3.0 (and subsequent) specification (Cable Television laboratories Inc.) provides for exemplary networking protocols both downstream and upstream, although the invention is in no way limited to these approaches. All versions of the DOCSIS and OCAP specifications are expressly incorporated herein by reference in their entireties for all purposes.

Furthermore in this regard, DOCSIS is an international telecommunications standard that permits the addition of high-speed data transfer to an existing cable TV (CATV) system. It is employed by many cable television operators to provide Internet access (cable Internet) over their existing hybrid fiber-coaxial (HFC) infrastructure. HFC systems using DOCSIS to transmit data are one non-limiting exemplary application context for one or more embodiments. However, one or more embodiments are applicable to a variety of different kinds of networks.

It is also worth noting that the use of DOCSIS Provisioning of EPON (Ethernet over Passive Optical Network) or "DPoE" (Specifications available from CableLabs, Louisville, Colo., USA) enables the transmission of high-speed data over PONs (Passive Optical Networks) using DOCSIS back-office systems and processes.

It will also be recognized that multiple servers (broadcast, VOD, or otherwise) can be used, and disposed at two or more different locations if desired, such as being part of different server "farms". These multiple servers can be used to feed one service group, or alternatively different service groups. In a simple architecture, a single server is used to feed one or more service groups. In another variant, multiple servers located at the same location are used to feed one or more service groups. In yet another variant, multiple servers disposed at different location are used to feed one or more service groups.

In some instances, material may also be obtained from a satellite feed 1108; such material is demodulated and decrypted in block 1106 and fed to block 162. Conditional access system 157 may be provided for access control purposes. Network management system 1110 may provide appropriate management functions. Note also that signals from MEM 162 and upstream signals from network 101 that have been demodulated and split in block 1112 are fed to CMTS and OOB system 156.

Also included in FIG. 3 are a global session resource manager (GSRM) 3302, a Mystro Application Server 104A, and a business management system 154, all of which are coupled to LAN 158. GSRM 3302 is one specific form of a DBWAD 1001 and is a non-limiting example of a session resource manager.

An ISP DNS server could be located in the head-end as shown at 3303, but it can also be located in a variety of other places. One or more Dynamic Host Configuration Protocol (DHCP) server(s) 3304 can also be located where shown or in different locations.

DAC (Digital Addressable Controller or Digital Access Controller) 163 is a non-limiting example of digital video access equipment. One non-limiting example of a DAC is the Digital Addressable Controller DAC6000 available from ARMS International plc of Suwanee, Ga., US. Different vendors of set-top boxes will have different types of digital video access equipment for use in the head end. Please note that DAC 163 can be located at any suitable place in head end 150; the depicted location between the VOD server 105 and MEM 162 is exemplary and non-limiting.

Figure 4:
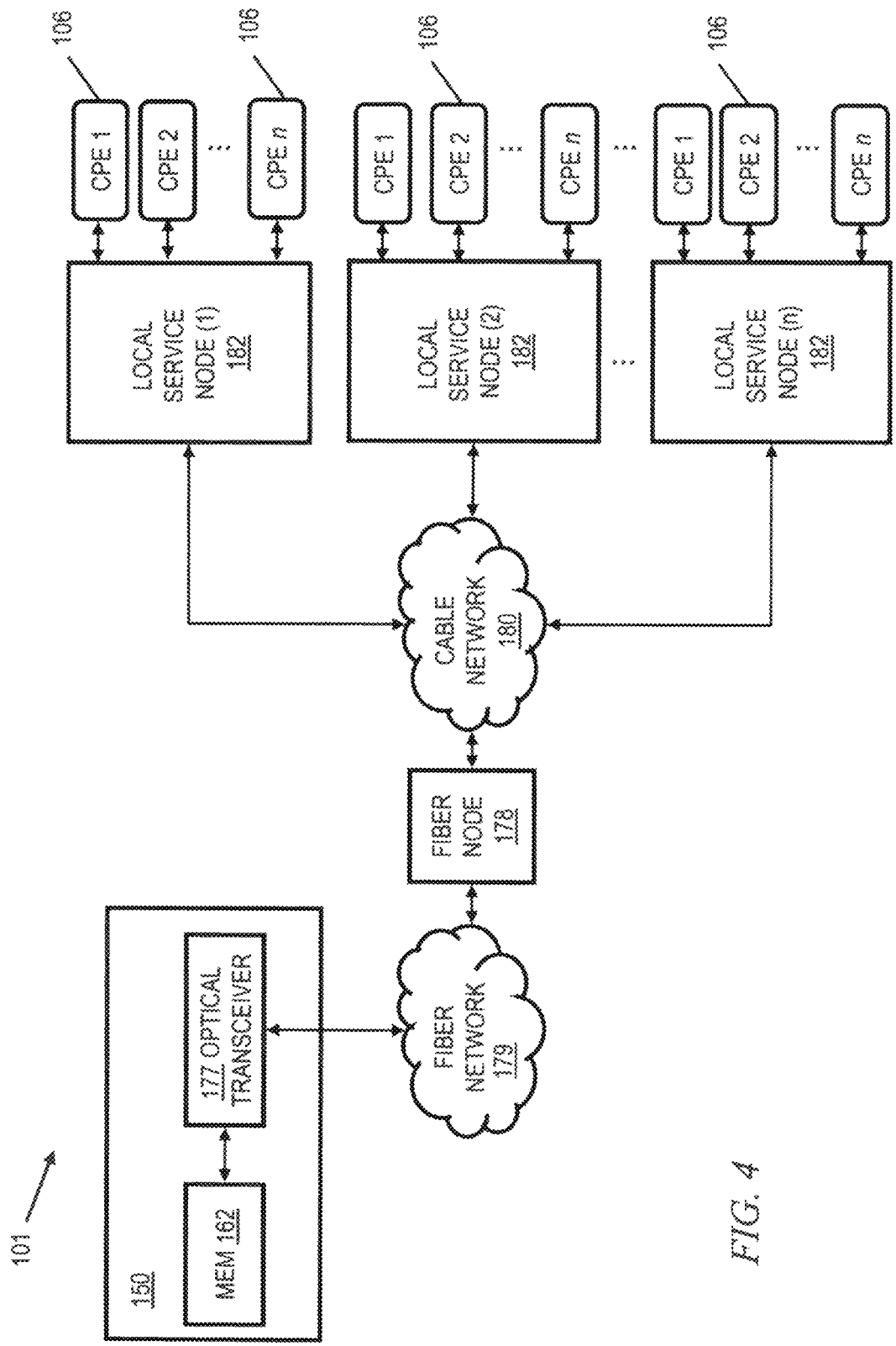
FIG. 4 is a functional block diagram illustrating one exemplary local service node configuration useful within the system of FIG. 1.

As shown in FIG. 4, the network 101 of FIGS. 2 and 3 comprises a fiber/coax arrangement wherein the output of the MEM 162 of FIG. 3 is transferred to the optical domain (such as via an optical transceiver 177 at the head-end 150 or further downstream). The optical domain signals are then distributed over a fiber network 179 to a fiber node 178, which further distributes the signals over a distribution network 180 (typically coax) to a plurality of local servicing nodes 182. This provides an effective 1-to-N expansion of the network at the local service end. Each node 182 services a number of CPEs 106. Further reference may be had to US Patent Publication 2007/0217436 of Markley et al., entitled "Methods and apparatus for centralized content and data delivery," the complete disclosure of which is expressly incorporated herein by reference in its entirety for all purposes. In one or more embodiments, the CPE 106 includes a cable modem, such as a DOCSIS-compliant cable modem (DCCM). Please note that the number n of CPE 106 per node 182 may be different than the number n of nodes 182, and that different nodes may service different numbers n of CPE.

Certain additional aspects of video or other content delivery will now be discussed. It should be understood that embodiments of the invention have broad applicability to a variety of different types of networks. Some embodiments relate to TCP/IP network connectivity for delivery of messages and/or content. Again, delivery of data over a video (or other) content network is but one non-limiting example of a context where one or more embodiments could be implemented. US Patent Publication 2003-0056217 of Paul D. Brooks, entitled "Technique for Effectively Providing Program Material in a Cable Television System," the complete disclosure of which is expressly incorporated herein by reference for all purposes, describes one exemplary broadcast switched digital architecture, although it will be recognized by those of ordinary skill that other approaches and architectures may be substituted. In a cable television system in accordance with the Brooks invention, program materials are made available to subscribers in a neighborhood on an as-needed basis. Specifically, when a subscriber at a set-top terminal selects a program channel to watch, the selection request is transmitted to a head end of the system. In response to such a request, a controller in the head end determines whether the material of the selected program channel has been made available to the neighborhood. If it has been made available, the controller identifies to the set-top terminal the carrier which is carrying the requested program material, and to which the set-top terminal tunes to obtain the requested program material. Otherwise, the controller assigns an unused carrier to carry the requested program material, and informs the set-top terminal of the identity of the newly assigned carrier. The controller also retires those carriers assigned for the program channels which are no longer watched by the subscribers in the neighborhood. Note that reference is made herein, for brevity, to features of the "Brooks invention"—it should be understood that no inference should be drawn that such features are necessarily present in all claimed embodiments of Brooks. The Brooks invention is directed to a technique for utilizing limited network bandwidth to distribute program materials to subscribers in a community access television (CATV) system. In accordance with the Brooks invention, the CATV system makes available to subscribers selected program channels, as opposed to all of the program channels furnished by the system as in prior art. In the Brooks CATV system, the program channels are provided on an as needed basis, and are selected to serve the subscribers in the same neighborhood requesting those channels.

US Patent Publication 2010-0313236 of Albert Straub, entitled "TECHNIQUES FOR UPGRADING SOFTWARE IN A VIDEO CONTENT NETWORK," the complete disclosure of which is expressly incorporated herein by reference for all purposes, provides additional details on the aforementioned dynamic bandwidth allocation device 1001.

US Patent Publication 2009-0248794 of William L. Helms, entitled "SYSTEM AND METHOD FOR CON- TENT SHARING," the complete disclosure of which is expressly incorporated herein by reference for all purposes, provides additional details on CPE in the form of a converged premises gateway device. Related aspects are also disclosed in US Patent Publication 2007-0217436 of Markley et al, entitled "METHODS AND APPARATUS FOR CENTRALIZED CONTENT AND DATA DELIVERY," the complete disclosure of which is expressly incorporated herein by reference for all purposes.

Figure 5:
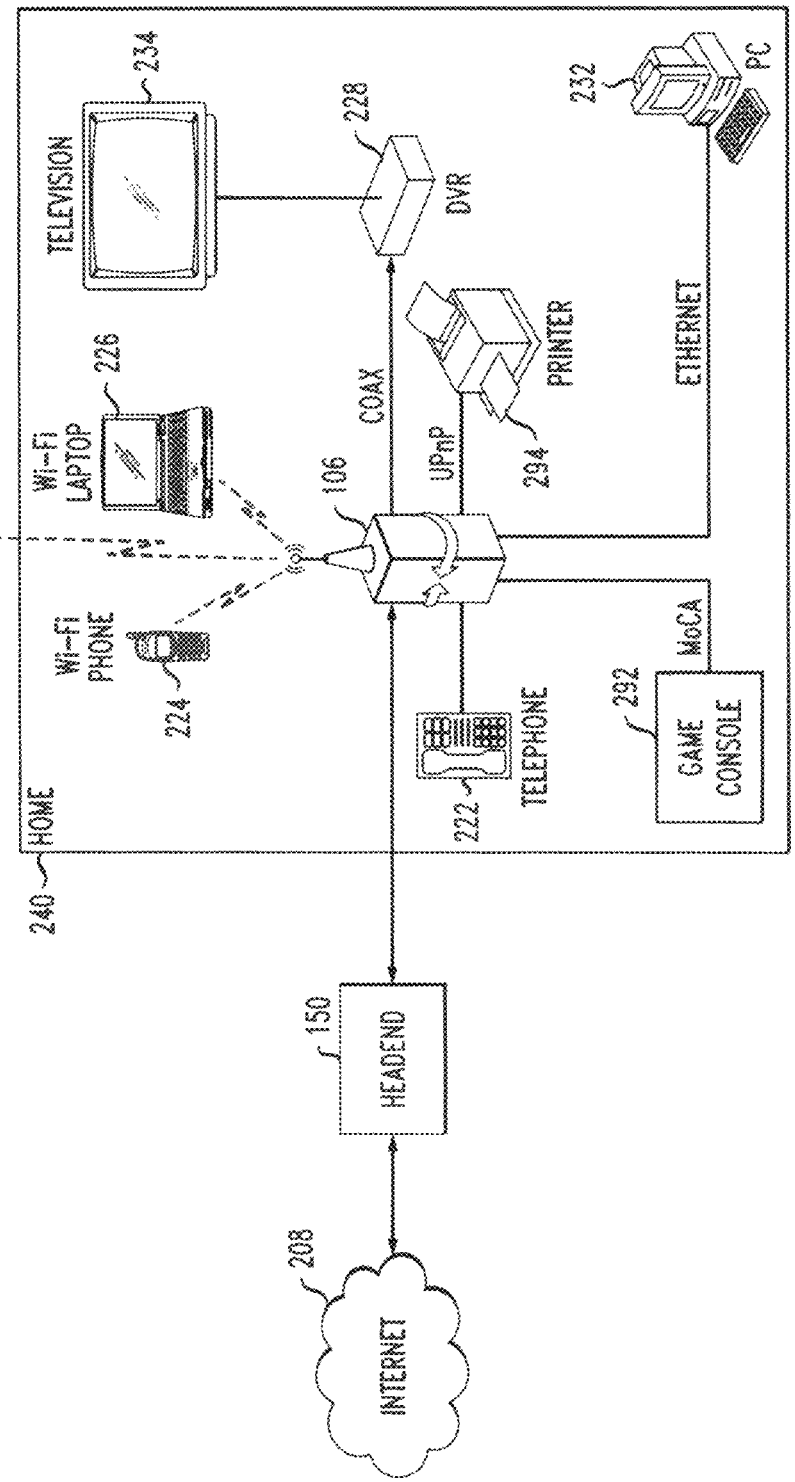
FIG. 5 is a functional block diagram of a premises network, including an exemplary centralized customer premises equipment (CPE) unit, interfacing with a head end such as that of FIG. 3.
Figure 6:
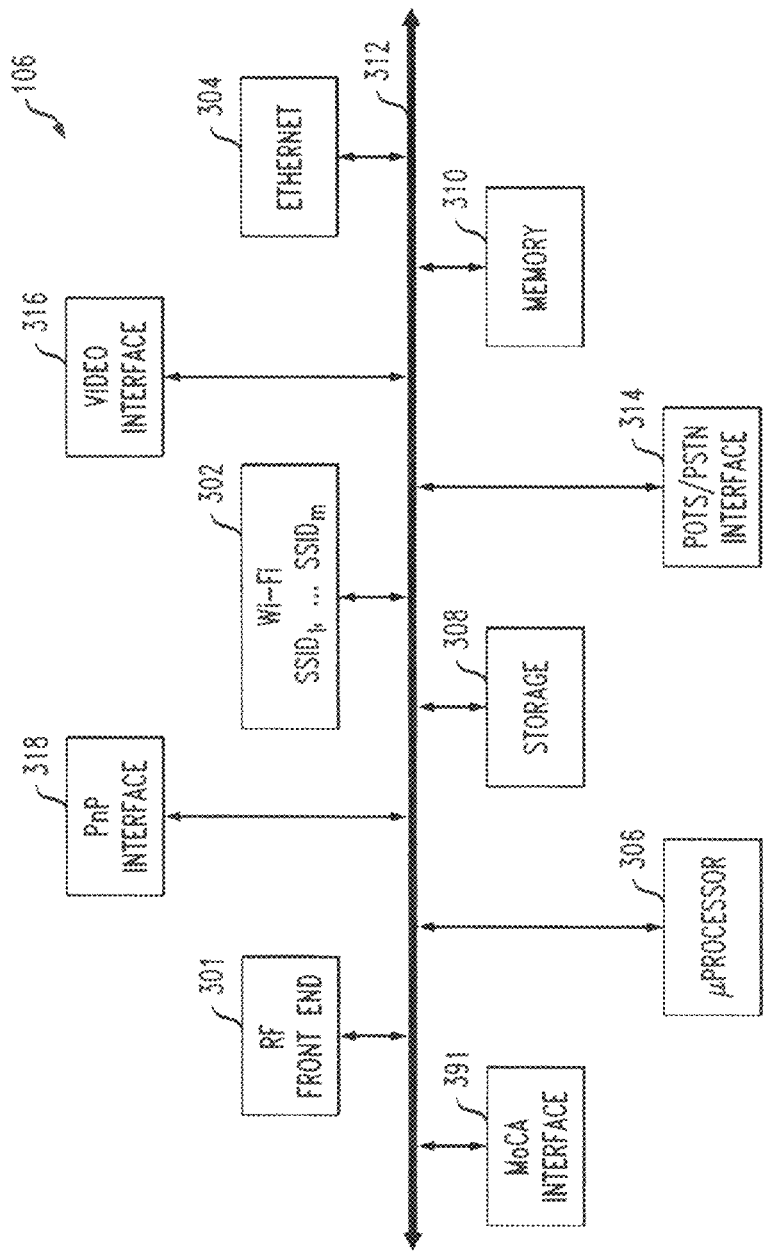
FIG. 6 is a functional block diagram of an exemplary centralized CPE unit, useful within the system of FIG. 1.

Reference should now be had to FIG. 5, which presents a block diagram of a premises network interfacing with a head end of an MSO or the like, providing Internet access. An exemplary advanced wireless gateway comprising CPE 106 is depicted as well. It is to be emphasized that the specific form of CPE 106 shown in FIGS. 5 and 6 is exemplary and non-limiting, and shows a number of optional features. Many other types of CPE can be employed in one or more embodiments; for example, a cable modem, DSL modem, and the like. The CPE can also be a Service Optical Network Unit (S-ONU) for FTTH deployment—see FIGS. 8 and 9 and accompanying text.

CPE 106 includes an advanced wireless gateway which connects to a head end 150 or other hub of a network, such as a video content network of an MSO or the like. The head end is coupled also to an internet (e.g., the Internet) 208 which is located external to the head end 150, such as via an Internet (IP) backbone or gateway (not shown).

The head end is in the illustrated embodiment coupled to multiple households or other premises, including the exemplary illustrated household 240. In particular, the head end (for example, a cable modem termination system 156 thereof) is coupled via the aforementioned HFC network and local coaxial cable or fiber drop to the premises, including the consumer premises equipment (CPE) 106. The exemplary CPE 106 is in signal communication with any number of different devices including, e.g., a wired telephony unit 222, a Wi-Fi or other wireless-enabled phone 224, a Wi-Fi or other wireless-enabled laptop 226, a session initiation protocol (SIP) phone, an H.323 terminal or gateway, etc. Additionally, the CPE 106 is also coupled to a digital video recorder (DVR) 228 (e.g., over coax), in turn coupled to television 234 via a wired or wireless interface (e.g., cabling, PAN or 802.15 UWB micro-net, etc.). CPE 106 is also in communication with a network (here, an Ethernet network compliant with IEEE Std. 802.3, although any number of other network protocols and topologies could be used) on which is a personal computer (PC) 232.

Other non-limiting exemplary devices that CPE 106 may communicate with include a printer 294; for example over a universal plug and play (UPnP) interface, and/or a game console 292; for example, over a multimedia over coax alliance (MoCA) interface.

In some instances, CPE 106 is also in signal communication with one or more roaming devices, generally represented by block 290.

A "home LAN" (HLAN) is created in the exemplary embodiment, which may include for example the network formed over the installed coaxial cabling in the premises, the Wi-Fi network, and so forth.

During operation, the CPE 106 exchanges signals with the head end over the interposed coax (and/or other, e.g., fiber) bearer medium. The signals include e.g., Internet traffic (IPv4 or IPv6), digital programming and other digital signaling or content such as digital (packet-based; e.g., VoIP) telephone service. The CPE 106 then exchanges this digital information after demodulation and any decryption (and any demultiplexing) to the particular system(s) to which it is directed or addressed. For example, in one embodiment, a MAC address or IP address can be used as the basis of directing traffic within the client-side environment 240.

Any number of different data flows may occur within the network depicted in FIG. 5. For example, the CPE 106 may exchange digital telephone signals from the head end which are further exchanged with the telephone unit 222, the Wi-Fi phone 224, or one or more roaming devices 290. The digital telephone signals may be IP-based such as Voice-over-IP (VoIP), or may utilize another protocol or transport mechanism. The well-known session initiation protocol (SIP) may be used, for example, in the context of a "SIP phone" for making multi-media calls. The network may also interface with a cellular or other wireless system, such as for example a 3G IMS (IP multimedia subsystem) system, in order to provide multimedia calls between a user or consumer in the household domain 240 (e.g., using a SIP phone or H.323 terminal) and a mobile 3G telephone or personal media device (PMD) user via that user's radio access network (RAN).

The CPE 106 may also exchange Internet traffic (e.g., TCP/IP and other packets) with the head end 150 which is further exchanged with the Wi-Fi laptop 226, the PC 232, one or more roaming devices 290, or other device. CPE 106 may also receive digital programming that is forwarded to the DVR 228 or to the television 234. Programming requests and other control information may be received by the CPE 106 and forwarded to the head end as well for appropriate handling.

FIG. 6 is a block diagram of one exemplary embodiment of the CPE 106 of FIG. 5. The exemplary CPE 106 includes an RF front end 301, Wi-Fi interface 302, video interface 316, "Plug n' Play" (PnP) interface 318 (for example, a UPnP interface) and Ethernet interface 304, each directly or indirectly coupled to a bus 312. In some cases, Wi-Fi interface 302 comprises a single wireless access point (WAP) running multiple ("m") service set identifiers (SSIDs). In some cases, multiple SSIDs, which could represent different applications, are served from a common WAP. For example, SSID 1 is for the home user, while SSID 2 may be for a managed security service, SSID 3 may be a managed home networking service, SSID 4 may be a hot spot, and so on. Each of these is on a separate IP subnetwork for security, accounting, and policy reasons. The microprocessor 306, storage unit 308, plain old telephone service (POTS)/public switched telephone network (PSTN) interface 314, and memory unit 310 are also coupled to the exemplary bus 312, as is a suitable MoCA interface 391. The memory unit 310 typically comprises a random-access memory (RAM) and storage unit 308 typically comprises a hard disk drive, an optical drive (e.g., CD-ROM or DVD), NAND flash memory, RAID (redundant array of inexpensive disks) configuration, or some combination thereof.

The illustrated CPE 106 can assume literally any discrete form factor, including those adapted for desktop, floor-standing, or wall-mounted use, or alternatively may be integrated in whole or part (e.g., on a common functional basis) with other devices if desired.

Again, it is to be emphasized that every embodiment need not necessarily have all the elements shown in FIG. 6—as noted, the specific form of CPE 106 shown in FIGS. 5 and 6 is exemplary and non-limiting, and shows a number of optional features. Yet again, many other types of CPE can be employed in one or more embodiments; for example, a cable modem, DSL modem, and the like.

It will be recognized that while a linear or centralized bus architecture is shown as the basis of the exemplary embodiment of FIG. 6, other bus architectures and topologies may be used. For example, a distributed or multi-stage bus architecture may be employed. Similarly, a "fabric" or other mechanism (e.g., crossbar switch, RAPIDIO interface, non-blocking matrix, TDMA or multiplexed system, etc.) may be used as the basis of at least some of the internal bus communications within the device. Furthermore, many if not all of the foregoing functions may be integrated into one or more integrated circuit (IC) devices in the form of an ASIC or "system-on-a-chip" (SoC). Myriad other architectures well known to those in the data processing and computer arts may accordingly be employed.

Yet again, it will also be recognized that the CPE configuration shown is essentially for illustrative purposes, and various other configurations of the CPE 106 are consistent with other embodiments of the invention. For example, the CPE 106 in FIG. 6 may not include all of the elements shown, and/or may include additional elements and interfaces such as for example an interface for the HomePlug A/V standard which transmits digital data over power lines, a PAN (e.g., 802.15), Bluetooth, or other short-range wireless interface for localized data communication, etc.

A suitable number of standard 10/100/1000 Base T Ethernet ports for the purpose of a Home LAN connection are provided in the exemplary device of FIG. 6; however, it will be appreciated that other rates (e.g., Gigabit Ethernet or 10-Gig-E) and local networking protocols (e.g., MoCA, USB, etc.) may be used. These interfaces may be serviced via a WLAN interface, wired RJ-45 ports, or otherwise. The CPE 106 can also include a plurality of RJ-11 ports for telephony interface, as well as a plurality of USB (e.g., USB 2.0) ports, and IEEE-1394 (Firewire) ports. S-video and other signal interfaces may also be provided if desired.

During operation of the CPE 106, software located in the storage unit 308 is run on the microprocessor 306 using the memory unit 310 (e.g., a program memory within or external to the microprocessor). The software controls the operation of the other components of the system, and provides various other functions within the CPE. Other system software/firmware may also be externally reprogrammed, such as using a download and reprogramming of the contents of the flash memory, replacement of files on the storage device or within other non-volatile storage, etc. This allows for remote reprogramming or reconfiguration of the CPE 106 by the MSO or other network agent.

It should be noted that some systems utilize a cloud-based user interface, wherein CPE 106 accesses a user interface on a server in the cloud, such as in NDC 1098.

The RF front end 301 of the exemplary embodiment comprises a cable modem of the type known in the art. In some cases, the CPE just includes the cable modem and omits the optional features. Content or data normally streamed over the cable modem can be received and distributed by the CPE 106, such as for example packetized video (e.g., IPTV). The digital data exchanged using RF front end 301 includes IP or other packetized protocol traffic that provides access to internet service. As is well known in cable modem technology, such data may be streamed over one or more dedicated QAMs resident on the HFC bearer medium, or even multiplexed or otherwise combined with QAMs allocated for content delivery, etc. The packetized (e.g., IP) traffic received by the CPE 106 may then be exchanged with other digital systems in the local environment 240 (or outside this environment by way of a gateway or portal) via, e.g. the Wi-Fi interface 302, Ethernet interface 304 or plug-and-play (PnP) interface 318.

Additionally, the RF front end 301 modulates, encrypts/multiplexes as required, and transmits digital information for receipt by upstream entities such as the CMTS or a network server. Digital data transmitted via the RF front end 301 may include, for example, MPEG-2 encoded programming data that is forwarded to a television monitor via the video interface 316. Programming data may also be stored on the CPE storage unit 308 for later distribution by way of the video interface 316, or using the Wi-Fi interface 302, Ethernet interface 304, Firewire (IEEE Std. 1394), USB/USB2, or any number of other such options.

Other devices such as portable music players (e.g., MP3 audio players) may be coupled to the CPE 106 via any number of different interfaces, and music and other media files downloaded for portable use and viewing.

In some instances, the CPE 106 includes a DOCSIS cable modem for delivery of traditional broadband Internet services. This connection can be shared by all Internet devices in the premises 240; e.g. Internet protocol television (IPTV) devices, PCs, laptops, etc., as well as by roaming devices 290. In addition, the CPE 106 can be remotely managed (such as from the head end 150, or another remote network agent) to support appropriate IP services. Some systems utilize a cloud-based user interface, wherein CPE 106 accesses a user interface on a server in the cloud, such as in NDC 1098.

In some instances the CPE 106 also creates a home Local Area Network (LAN) utilizing the existing coaxial cable in the home. For example, an Ethernet-over-coax based technology allows services to be delivered to other devices in the home utilizing a frequency outside (e.g., above) the traditional cable service delivery frequencies. For example, frequencies on the order of 1150 MHz could be used to deliver data and applications to other devices in the home such as PCs, PMDs, media extenders and set-top boxes. The coaxial network is merely the bearer; devices on the network utilize Ethernet or other comparable networking protocols over this bearer.

The exemplary CPE 106 shown in FIGS. 5 and 6 acts as a Wi-Fi access point (AP), thereby allowing Wi-Fi enabled devices to connect to the home network and access Internet, media, and other resources on the network. This functionality can be omitted in some cases.

In one embodiment, Wi-Fi interface 302 comprises a single wireless access point (WAP) running multiple ("m") service set identifiers (SSIDs). One or more SSIDs can be set aside for the home network while one or more SSIDs can be set aside for roaming devices 290.

A premises gateway software management package (application) is also provided to control, configure, monitor and provision the CPE 106 from the cable head-end 150 or other remote network node via the cable modem (DOCSIS) interface. This control allows a remote user to configure and monitor the CPE 106 and home network. Yet again, it should be noted that some systems employ a cloud-based user interface, wherein CPE 106 accesses a user interface on a server in the cloud, such as in NDC 1098. The MoCA interface 391 can be configured, for example, in accordance with the MoCA 1.0, 1.1, or 2.0 specifications.

As discussed above, the optional Wi-Fi wireless interface 302 is, in some instances, also configured to provide a plurality of unique service set identifiers (SSIDs) simultaneously. These SSIDs are configurable (locally or remotely), such as via a web page.

Figure 8:
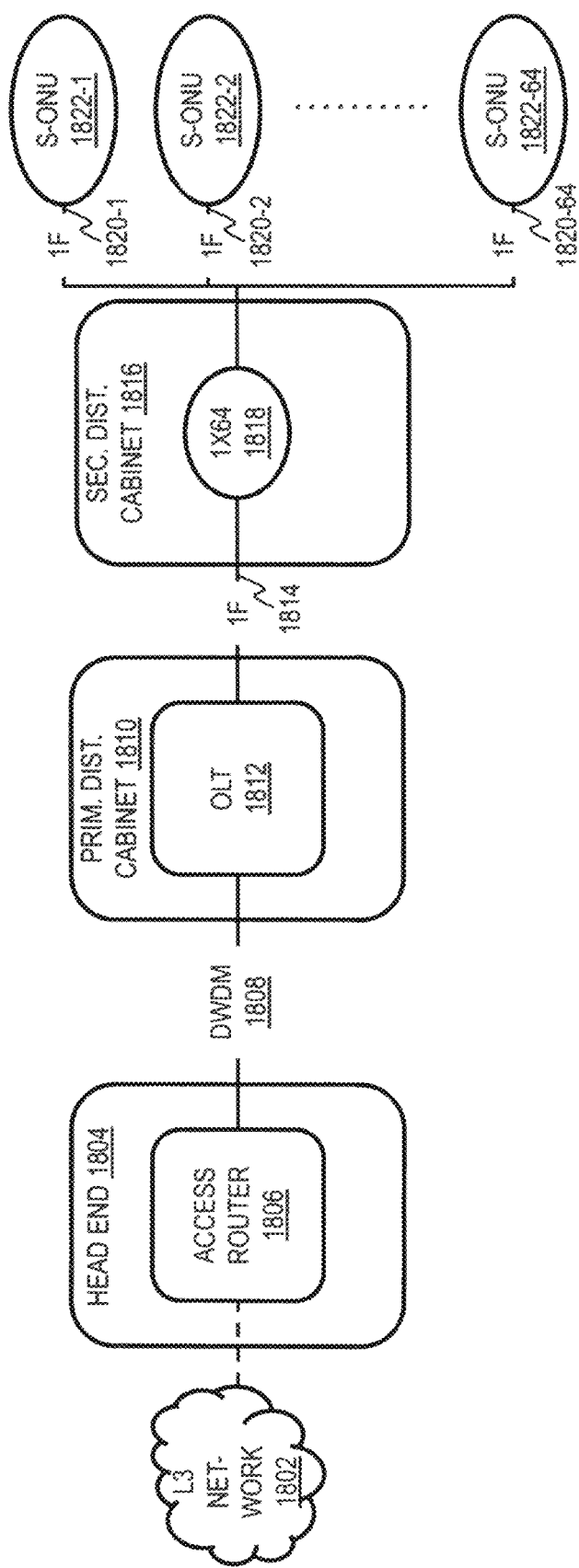
FIG. 8 is a functional block diagram illustrating an exemplary FTTH system, which is one exemplary system within which one or more embodiments could be employed.

As noted, there are also fiber networks for fiber to the home (FTTH) deployments (also known as fiber to the premises or FTTP), where the CPE is a Service ONU (S-ONU; ONU=optical network unit). Referring now to FIG. 8, L3 network 1802 generally represents the elements in FIG. 1 upstream of the head ends 150, while head end 1804, including access router 1806, is an alternative form of head end that can be used in lieu of or in addition to head ends 150 in one or more embodiments. Head end 1804 is suitable for FTTH implementations. Access router 1806 of head end 1804 is coupled to optical line terminal 1812 in primary distribution cabinet 1810 via dense wavelength division multiplexing (DWDM) network 1808. Single fiber coupling 1814 is then provided to a 1:64 splitter 1818 in secondary distribution cabinet 1816 which provides a 64:1 expansion to sixty-four S-ONUs 1822-1 through 1822-64 (in multiple premises) via sixty-four single fibers 1820-1 through 1820-64, it being understood that a different ratio splitter could be used in other embodiments and/or that not all of the 64 (or other number of) outlet ports are necessarily connected to an S-ONU.

Figure 9:
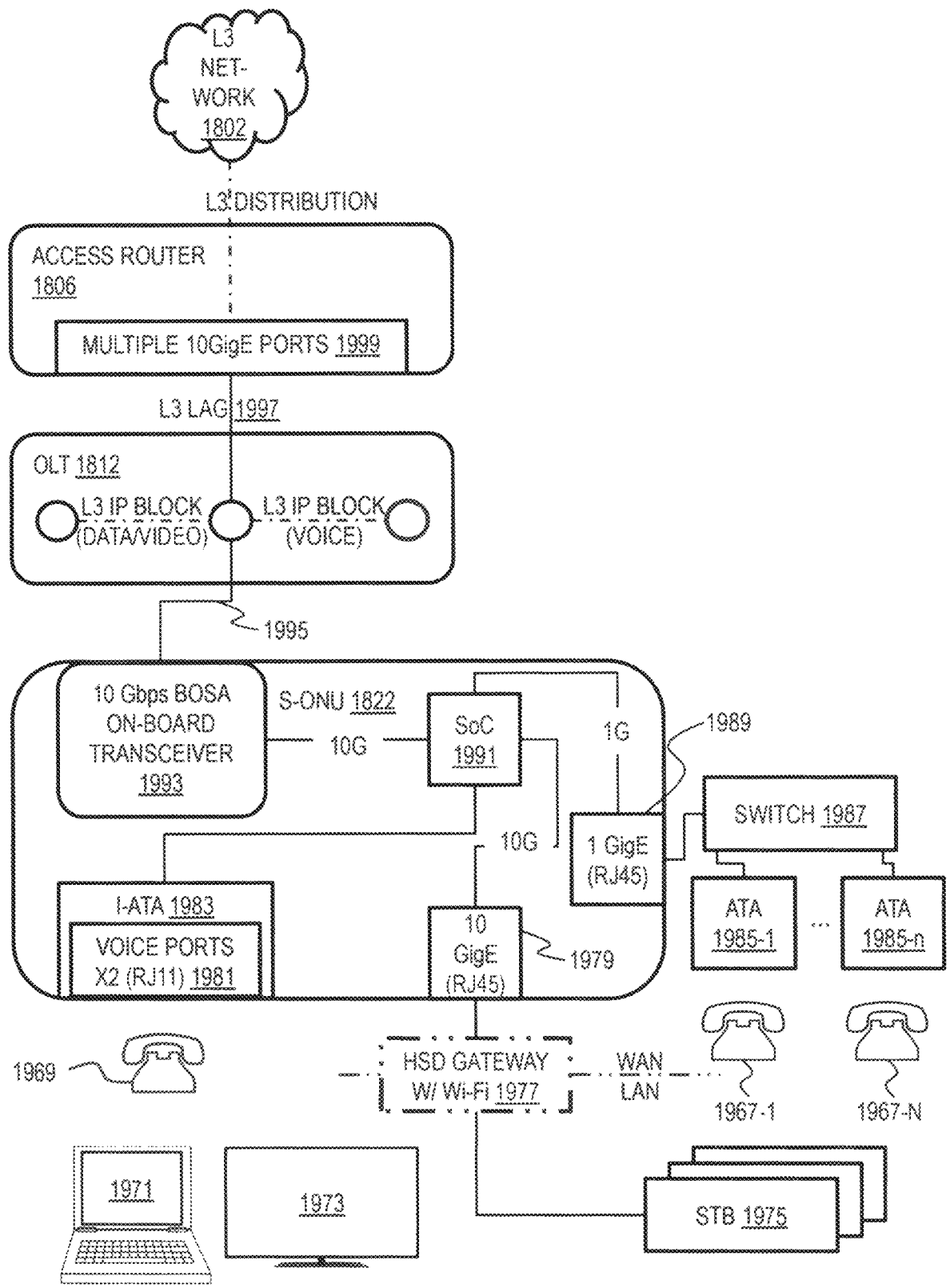
FIG. 9 is a functional block diagram of an exemplary centralized S-ONU CPE unit interfacing with the system of FIG. 8.

Giving attention now to FIG. 9, wherein elements similar to those in FIG. 8 have been given the same reference number, access router 1806 is provided with multiple ten-Gigabit Ethernet ports 1999 and is coupled to OLT 1812 via L3 (layer 3) link aggregation group (LAG) 1997. OLT 1812 can include an L3 IP block for data and video, and another L3 IP block for voice, for example. In a non-limiting example, S-ONU 1822 includes a 10 Gbps bi-directional optical subassembly (BOSA) on-board transceiver 1993 with a 10G connection to system-on-chip (SoC) 1991. SoC 1991 is coupled to a 10 Gigabit Ethernet RJ45 port 1979, to which a high-speed data gateway 1977 with Wi-Fi capability is connected via category 5E cable. Gateway 1977 is coupled to one or more set-top boxes 1975 via category 5e, and effectively serves as a wide area network (WAN) to local area network (LAN) gateway. Wireless and/or wired connections can be provided to devices such as laptops 1971, televisions 1973, and the like, in a known manner. Appropriate telephonic capability can be provided. In a non-limiting example, residential customers are provided with an internal integrated voice gateway (I-ATA or internal analog telephone adapter) 1983 coupled to SoC 1991, with two RJ11 voice ports 1981 to which up to two analog telephones 1969 can be connected. Furthermore, in a non-limiting example, business customers are further provided with a 1 Gigabit Ethernet RJ45 port 1989 coupled to SoC 1991, to which switch 1987 is coupled via Category 5e cable. Switch 1987 provides connectivity for a desired number n (typically more than two) of analog telephones 1967-1 through 1967-n, suitable for the needs of the business, via external analog telephone adapters (ATAs) 1985-1 through 1985-n. The parameter "n" in FIG. 9 is not necessarily the same as the parameter "n" in other figures, but rather generally represents a desired number of units. Connection 1995 can be, for example, via SMF (single-mode optical fiber).

In addition to "broadcast" content (e.g., video programming), the systems of FIGS. 1-6, 8, and 9 can, if desired, also deliver Internet data services using the Internet protocol (IP), although other protocols and transport mechanisms of the type well known in the digital communication art may be substituted. In the systems of FIGS. 1-6, the IP packets are typically transmitted on RF channels that are different that the RF channels used for the broadcast video and audio programming, although this is not a requirement. The CPE 106 are each configured to monitor the particular assigned RF channel (such as via a port or socket ID/address, or other such mechanism) for IP packets intended for the subscriber premises/address that they serve.

Modular Communications Equipment Support

As noted above, part of the physical plant of a cable or fiber optic network, or other video content network, is the so-called node housing, which typically hangs from a cable by the curb outside a premises or is mounted on a pedestal at the curb outside a premises, between the head end 150 and home (or other premises) 240 in FIG. 5. Current node housings may have issues with weight, heat dissipation, repetitive stress cycling, and/or difficulty in changing out internal components for service upgrades and the like. Many prior art devices have employed a cast construction. One or more embodiments instead employ a frame (optionally optimized for structural requirements) with panels (optionally optimized for weight and/or thermal requirements).

One pertinent aspect related to a re-usable node housing is that the cable industry is undergoing network changes that lead to the number of types of nodes coming to an inflexion point. The number of types of nodes is set to increase rapidly over the next few years as the industry becomes the backhaul for cellular data systems, due to the move towards distributed architecture (DAA) network components, and due to the creation of new nodes that offer compute and storage features that have a physical presence in the outdoor network. Hence, a modular approach is desirable to address these network changes.

Figure 10:
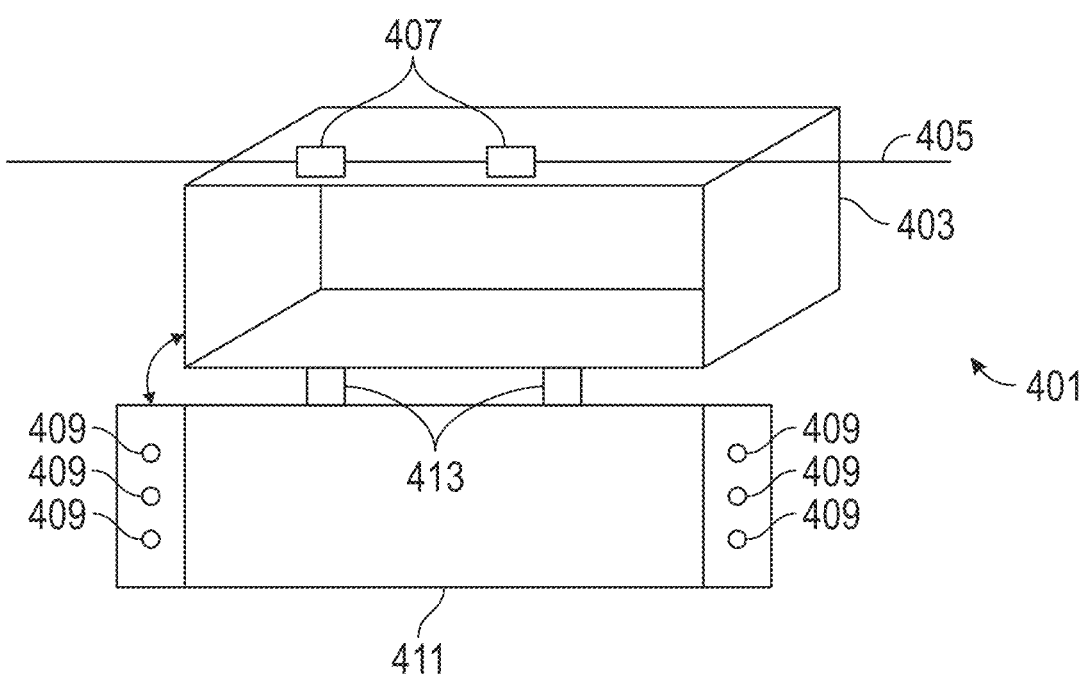
FIG. 10 shows a first node housing according to the prior art.
Figure 11:
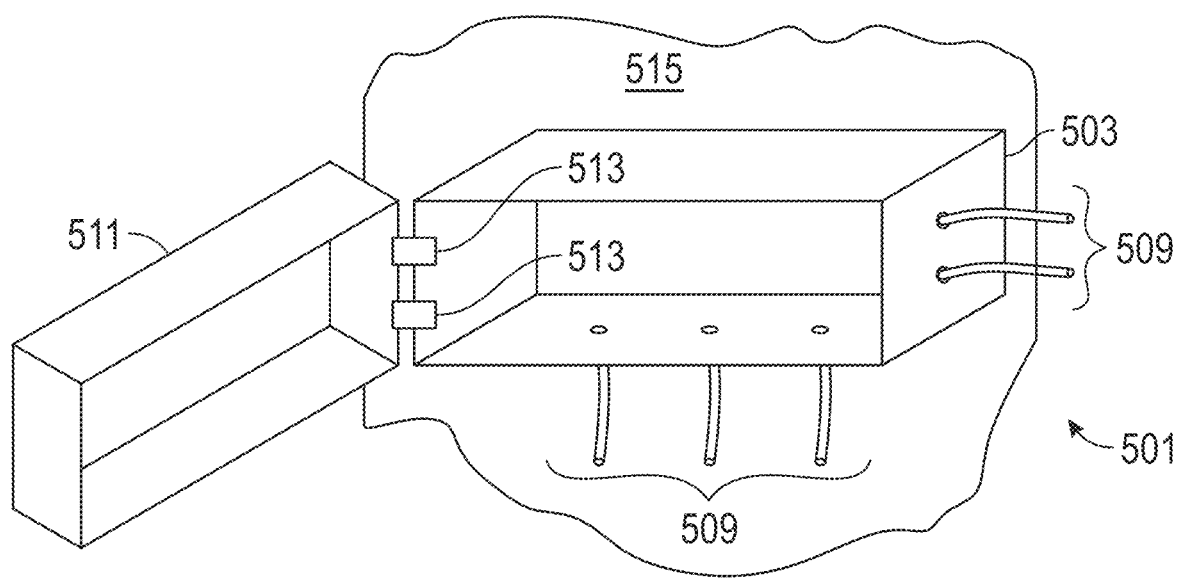
FIG. 11 shows a second node housing according to the prior art.

Referring to FIGS. 10 and 11, prior art node housings 401, 501 are used in industry to house electronics equipment including active circuitry and the like; e.g., amplifiers, lasers, etc. Prior art housings for these devices are typically in a clamshell format; i.e., a hinged box. As shown in FIG. 10, in some cases, one side, the base 403, is typically suspended from the supporting strand (steel) cable 405 via clamps 407. The data and electric cables 409 which supply power to the active components (not shown) inside unit 401 are set into the lid 411 which hinges down via hinges 413. In an alternative approach seen in FIG. 11, data and electric cables 509 which supply power to the active components (not shown) inside unit 501 are set into the base 503; i.e., the data and electrical connections 509 go directly into the housing 503 itself. Cover 511 is hinged to base 503 by hinges 513 (which could instead be located along the long edges). Unit 501 is mounted to wall 515; however, unit 401 could be mounted to a wall and/or unit 501 could be suspended from a cable.

Currently, when it is desired to perform a substantial technology upgrade in units such as 501, it is necessary to cut out the cables 509 from the casting forming portion 503. With current technology, the lid material in devices such as 401 must be structural so as to be able to support the electrical and mechanical connections 409. Current systems suffer from the problem that the connections must be disturbed in order to change the components inside the housing. Metal fatigue and/or corrosion often result in breaking of the connections. Indeed, in prior art systems such as 401, lid 411 opens up and coaxial cables 409 are routed into and out of the lid. Every time the lid is opened, a fatigue cycle is placed on all of the data and electrical connections to cables 409. In other prior art systems such as 501, the lines 509 run into the base 503 but then when an upgrade is desired, everything must be cut out. FIGS. 10 and 11 thus show two prior art approaches (cables to lid with fatigue issues as per 401; cables to base approach with need to cut everything to make changes, with expense and labor, as per 501).

Figure 12:
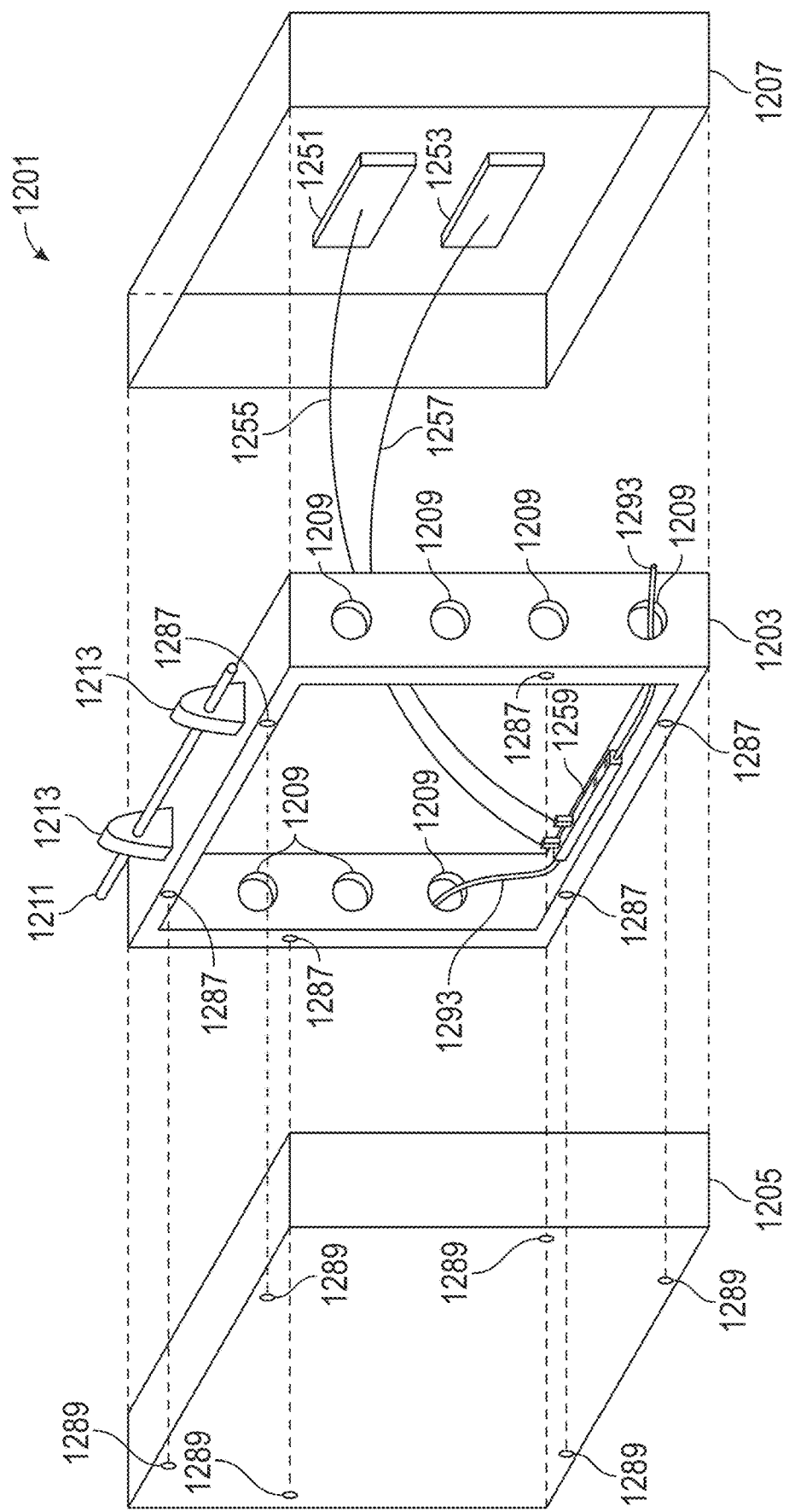
FIG. 12 shows a first embodiment of a node housing according to an aspect of the invention.
Figure 13:
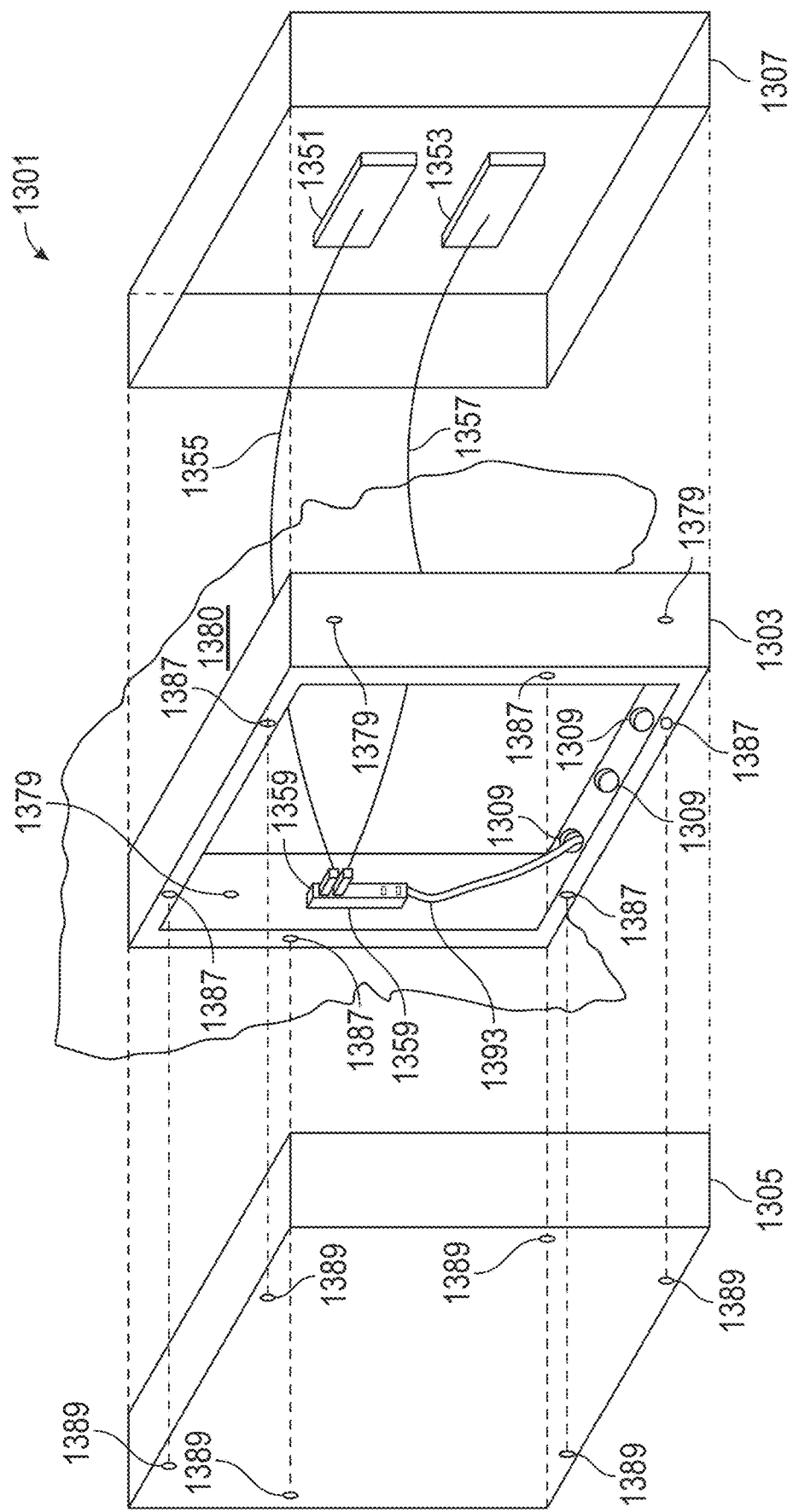
FIG. 13 shows a second embodiment of a node housing according to an aspect of the invention.

Referring to FIGS. 12 and 13, one or more embodiments 1201, 1301 employ a ring-like frame 1203, 1303 with detachable front 1205, 1305 and back 1207, 1307 shells so that the equipment (discussed below) inside can be changed without disturbing the electrical connections for power and data at 1209, 1309. Exemplary embodiment 1201 is suspended from a cable 1211 by clamps 1213. Exemplary embodiment 1301 is a wall or pedestal mount as will be discussed further below.

Regarding the above-mentioned equipment inside the shells, in one or more embodiments, modules 1251, 1253 mount inside the covers and have wires (in a non-limiting example, ribbon cable) 1255, 1257 running to a connector block 1259 on the ring. Block 1259 can include a suitable number of connection ports. For illustrative convenience, only two modules 1251, 1253 are shown. However, there can be many modules, and modules can also be located in shell 1205 as well as shell 1207; the modules are only shown in shell 1207 in FIG. 12 for illustrative convenience. Non-limiting exemplary types of modules include power supplies; an HFC/RF Amplifier or HFC/RF Tray; a DOC SIS module; a PON module; an ePON module; a Wi-Fi module; a small cell 5G module; an optical switch module; an Ethernet aggregation module; an Intel or AMD lump compute module; and the like. In one or more embodiments, to ensure good thermal contact between the modules 1251, 1253 and the shells 1205 or 1207 as the case may be, a tight screw connection with good metal-to-metal contact is employed to a passive heat sink on the outside (e.g. as in FIG. 15 discussed below). In some embodiments, thermal grease or Indium foil can be employed as a thermal interface material between the modules and the shell. Holes 1209 pass one or more cables 1293 (and/or 1295, see FIG. 14) running to the connector block 1259. Elements 1351, 1353, 1355, 1357, 1359, and 1393 in FIG. 13 are generally analogous to elements 1251, 1253, 1255, 1257, 1259, and 1293 in FIG. 12.

Figure 14:
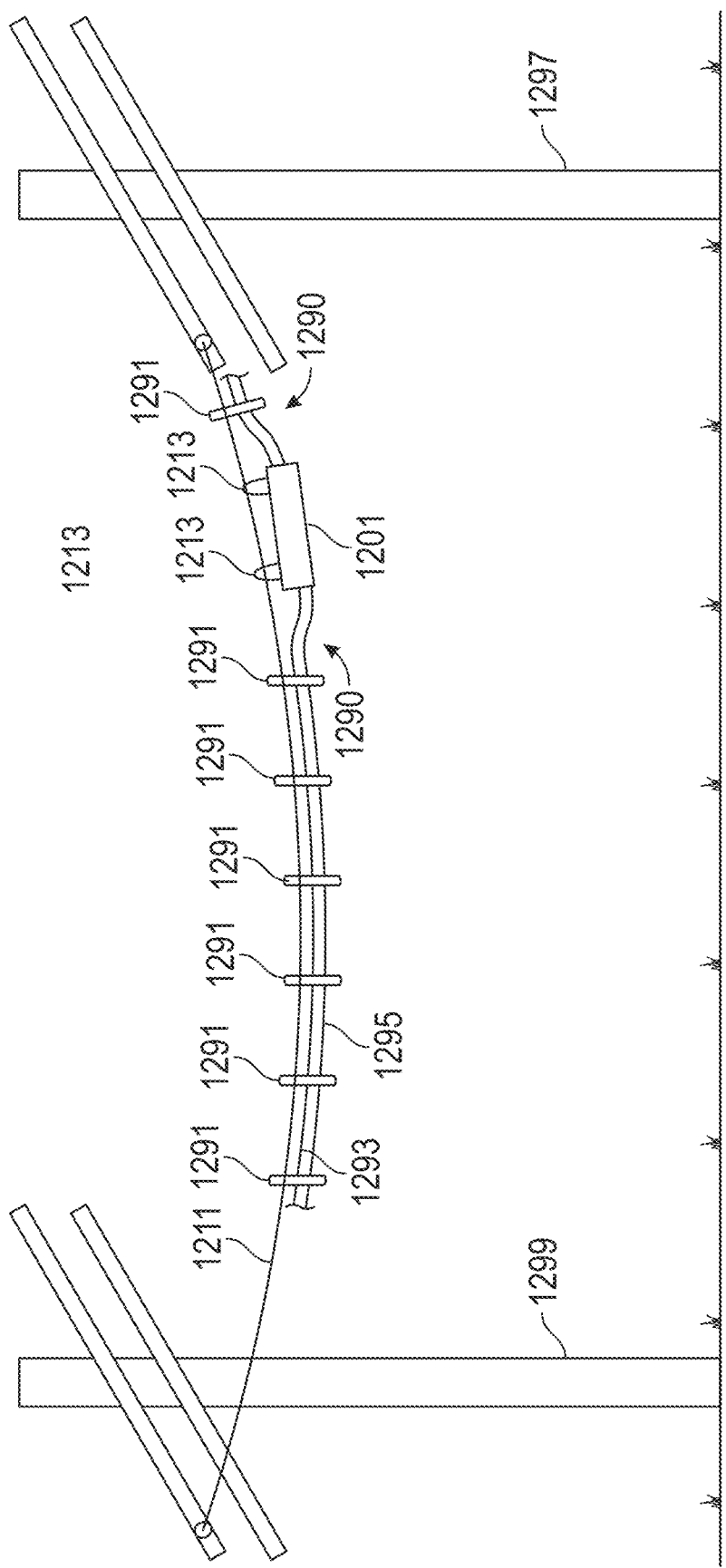
FIG. 14 shows one typical installation of a node housing according to an aspect of the invention.

Referring now to FIG. 14, the node housings 1201 hang from a cable strand 1211 ("aerial strand") via clamps 1213; the strand 1211 is suspended from telephone poles 1299, 1297. The electrical connections for power and data that are shown at 1209 in FIG. 12 interface with cables 1295, 1293, for example. One or more embodiments such as 1201, 1301 reduce or eliminate the need to disturb the connections when servicing and/or changing active components inside the housing. Cables 1295, 1293 are mechanically fastened to strand 1211 (e.g. via wrapping and/or ties 1291) and have slack potions 1290 that connect to housing 1201. Aerial strand 1211 is structural, attached pole-to-pole, and takes tension while cables 1295, 1293 are attached to strand 1211 which supports their weight.

As the skilled artisan will appreciate, "node housings" are variously referred to in the industry as nodes, node housings, trunk amplifiers, small cell node housings, remote node OLT housings, or line extender amplifiers.

As noted, in some embodiments, the ring frame 1203 is suspended from an aerial strand 1211, while other embodiments such as 1301 can be wall or pedestal mounted. Some embodiments take the place of so-called "doghouses." The ring frame 1203, 1303 can be configured such that cables can come in at any direction (fastening at 1209, 1309, e.g.) and detachable housing parts 1205, 1207, 1305, 1307 that contain electronic components are not impacted.

Current node housings are typically made of aluminum because the housing has to serve as both a heat sink and a structural component to resist stresses imposed by the cables. In one or more embodiments such as 1201, 1301, the frame 1203, 1303 is optimized to be structural in nature while the left 1205, 1305 and right 1207, 1307 housing halves are optimized for heat sinking and/or can be made transparent to radio waves if it is desired to have radiating components inside units 1201, 1301. Prior art aluminum construction will act as a Faraday cage and not be suitable. In embodiment 1201, the sides of the frame having ports 1209 will be in bending while the sides parallel to the cable 1211 will be in tension. Covers 1205, 1207 act as heat sinks for free convection.

Figure 15:
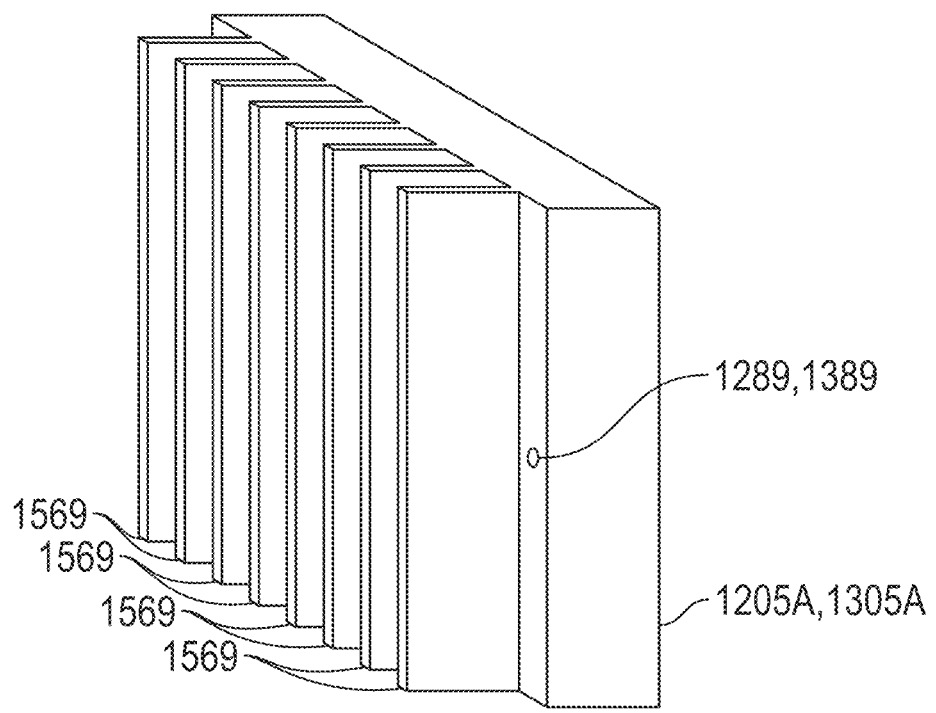
FIG. 15 shows a finned node housing cover suitable for use with the embodiments of FIGS. 12 and 13.

FIG. 15 shows an exemplary cover 1205A, 1305A with vertical fins 1569 to facilitate thermal control via free convection. Fastener holes 1289, 1389 or alternative fasteners can be provided as described elsewhere herein. Holes could be located, for example, in the regions between the fins and/or the fins could be selectively relieved in a radius around the hole to permit access.

Referring again to embodiment 1201 of FIG. 12, frame 1203 hangs from cable 1211 by clamps 1213 or the like. Various types of cable clamps can be used.

Referring again to embodiment 1301 of FIG. 13, mounting holes 1379 can be provided to fasten ring frame 1303 to a wall, pedestal, or the like (generally 1380); the number, size, and location may vary. The mounting holes could also be provided on cover 1307 instead of ring frame 1303; for example, for a wall mount as opposed to a strand (overhead cable) mount.

Referring to FIGS. 12 and 13, sides 1205/1207, 1305/1307 are provided with connection points as needed. Sides 1205/1207, 1305/1307 can be screwed in, pinned on, bolted, hinged, clamped via toggles or the like, glued (although gluing is not desirable for serviceability), and so on. The number, locations, and type of fastener(s) can be varied depending on the application. The non-limiting examples of FIGS. 12 and 13 show clearance holes 1289, 1389 and corresponding threaded holes 1287, 1387. Covers 1207, 1307 can have similar attachments, omitted to avoid clutter. Rectangular frame 1203, 1303 is open on the left and right sides. Covers 1205/1207, 1305/1307 are five sided; i.e., open on the side facing frame 1203, 1303 but otherwise closed. The depth of the covers can vary depending on the units to be housed and the depths can be the same or different.

Figure 16:
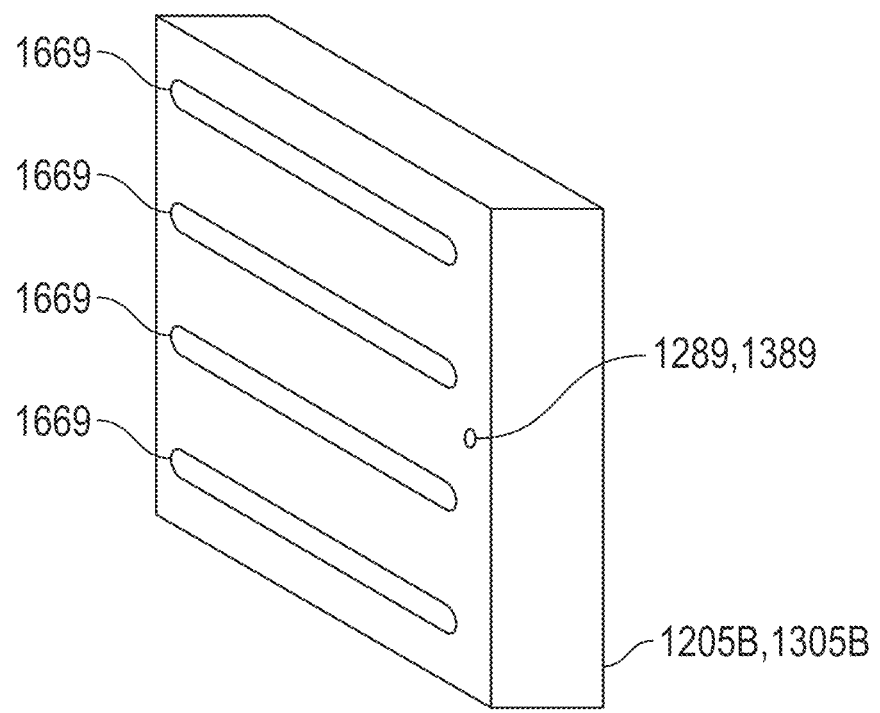
FIG. 16 shows a node housing cover with embedded heat pipes, suitable for use with the embodiments of FIGS. 12 and 13.

In one or more embodiments, components 1251, 1253 such as power supplies are placed in the covers 1205, 1207 for easy access. Relatively heavy frame 1203 holds connections 1209 and takes mechanical loads. The number, size, and location of electrical supply and data connections 1209, 1309 can vary depending on the application. Covers 1205/1207 and 1305/1307 can be finned and thermally conductive for convective cooling, as seen in FIG. 15 (generally representative of front and back covers). Covers 1205/1207 and 1305/1307 can be made of aluminum or of materials with enhanced thermal and/or structural properties on a weight basis as compared to aluminum; e.g., a composite with thermally conductive fibers embedded in the resin; a carbon fiber reinforced aluminum composite; or heat pipes can be embedded in the covers 1205, 1207, 1305, 1307. Refer to FIG. 16, which shows an exemplary cover 1205B, 1305B with heat pipes 1669 to facilitate thermal control. Fastener holes 1289, 1389 or alternative fasteners can be provided as described elsewhere herein. Holes could be located, for example, in the regions between the heat pipes and/or on edges away from heat pipes. The heat pipes can be oriented horizontally as shown and function by capillary action or could have a different orientation in some embodiments if appropriate. As used herein, a heat pipe is a heat-transfer device that combines the principles of both thermal conductivity and phase transition to effectively transfer heat between two solid interfaces. At the hot interface of a heat pipe a liquid in contact with a thermally conductive solid surface turns into a vapor by absorbing heat from that surface. The vapor then travels along the heat pipe to the cold interface and condenses back into a liquid—releasing the latent heat. The liquid then returns to the hot interface through either capillary action, centrifugal force, or gravity, and the cycle repeats.

In some applications, units are limited to a weight of 50 lbs.; if made of Aluminum, units meeting that weight limit can typically only dissipate about 170-180 Watts. By removing the need for the sides to be structural in nature, as in prior art techniques, embodiments can be lighter and have enhanced heat dissipation.

Note that environmental and electromagnetic interference (EMI) seals are omitted from FIGS. 12 and 13 to avoid clutter but suitable gaskets, O-rings in grooves, or the like can be employed as appropriate.

Embodiments are not limited to cable/HFC video and data applications, but can be used in a variety of applications, such as wireless, Wi-Fi, or fiber optic networking and the like.

Note that elements 1255, 1257, 1293, 1355, 1357, and 1393 generally represent both data and power connectivity.

One or more embodiments thus include a frame that provides the connection interface for data, electrical supply, and mechanical support for the electrical equipment needed for a given application. A variety of additional housings can be added to this frame to provide support and environmental protection for electrical components. Servicing, adding or removing these additional housing or components does not require disturbing the existing external data, electrical supply or mechanical supports as is typical of the current state of the art.

Currently, housings that contain Outside Plant Equipment (OPE) have mechanical supports, data connections, and electrical supply connections directly cast into the housing body. These housings are typically cast out of aluminum alloys, come in a variety of form factors, dependent upon the specific application, technology contained therein, and usually some amount of customization based on specific network operator requirements. As technology and end-user requirements evolve, the internal components of these housings need to be upgraded. Upgrading internal components often also requires replacement of the housing the components that exist within. When the housings are removed and replaced, the supports and connectors must be disturbed, and this often necessitates replacement of the supports, connections, and cables, due to environmental degradation of these connections. Mechanical manipulation of these connections further decreases their useful life. When these cables and connections fail, they need to be replaced. The replacement of cabling is expensive, and is disruptive to services for customers, as the connections are broken for some time while replacements are put into place and new connections established.

Some housing designs feature replaceable lids, and often external connections are made to these lids. Because the connections are made to the lid, the connections are also disturbed when the lids are replaced, again requiring replacement of connections. An additional issue with connections being made to the lid is that regular maintenance operations, the housings are often opened, and the process of opening and closing the housings shortens the effective life of the connections as they are subject to fatigue cycles. Other housing implementations have the attachments made to the base of the housings, and while this reduces the need to disturb connections during regular maintenance operations, base replacements to support system upgrades are very time consuming and labor intensive. Because the housings provide mechanical support for the data and electrical supply connections, they must be made from materials suitable for providing such support. This limits the choices to materials that are often not optimized for the given application. By using a frame, each side of the housing can be manipulated or replaced as needed. The housing materials need not be made of structural materials, and regular maintenance operations do not require manipulating the connections, which increases system reliability. A wider choice of housing materials also provides designers with more options than today, allowing choices to be made for weight savings, heat dissipation, corrosion resistance, and the like.

It is worth noting that embodiments of the invention can be used for nodes as well as amplifier and tap housings, and similar applications. Other applications may be sized differently, for example, as they serve different purposes, but can benefit from the same concept of making power and signal connections to a ring-like frame that is (in a non-limiting example) structurally robust, while locating components in shoe-box like covers that do not require structural robustness and can be optimized, for example, for weight, thermal, and/or RF parameters.

Recapitulation

Given the discussion thus far, and with attention again to FIGS. 12-16, it will be appreciated that, in general terms, an exemplary assembly, according to an aspect of the invention, includes a ring frame 1203, 1303 having first and second open sides and an electrical connector block 1259, 1359; as well as a mounting structure (e.g., cable 1211, wall or pedestal 1380) to which the ring frame is secured. A plurality (e.g. two or more) of power and signal cable connection points 1209, 1309 are defined on the ring frame. Non-limiting examples of connection points include connections for HFC/coax five hundred, so-called "six and one quarter," seven-fifty, optical fiber, and the like (the skilled artisan will appreciate that five hundred, six and one quarter/six twenty-five, and seven-fifty are hardline coax cable sizes).

A plurality of power and signal cables (e.g. 1295, 1293) are coupled to the power and signal cable connection points and the connector block 1259, 1359. First and second covers 1205/1305, 1207/1307 are secured to the ring frame. Each of the first and second covers is open on one side facing the ring frame and defines a mounting cavity. A plurality of heat-dissipating electronic components are mechanically and thermally coupled to the first and second covers and located in the mounting cavities. The heat-dissipating electronic components are releasably electrically coupled to the electrical connector block in one or more embodiments. For example, the heat-dissipating electronic components are electrically coupled to the electrical connector block using snap-in or screw-in connectors that do not require soldering, brazing, or complicated tools for disconnection and reconnection.

In some instances, total weight may be limited to about 50 pounds because of health and safety regulations. In one or more embodiments, using a structural ring 1203, 1303 with lightweight heat-conductive clamshells 1205, 1207, 1305, 1307 is more weight efficient than prior art designs. Some embodiments could use a carbon fiber ring 1203, 1303 with clamshells of cast aluminum, also for a good balance of weight and thermal control. Advantageously, in designs such as that depicted in FIGS. 12 and 14, the frame 1203 stays suspended from strand 1211, the clamshells can be readily opened, and components 1251, 1253 in the clamshells can be readily connected/disconnected to/from connectors 1259 on ring 1203 without disturbance.

In at least some cases, the ring frame 1203, 1303 is structurally robust and the first and second covers 1205/1305, 1207/1307 are selected or even optimized for at least one of weight, thermal conductivity, and radio frequency (RF) properties.

As seen in FIGS. 12 and 14, in some cases, the mounting structure includes an aerial cable 1211, and the assembly further includes cable clamps 1213 securing the ring frame to the aerial cable. Furthermore in this regard, in one or more embodiments, mounting to the cable from the ring-frame instead of the covers (as is traditionally done) provides better mechanical securement, housing balance, and access, and an opportunity to replace only the ring-frame in the event of mounting damage (no need to scrap either of the more expensive lids/covers).

On the other hand, as seen in FIG. 13, in some cases, the mounting structure includes one of a pedestal and a building wall.

The ring frame can be formed from, e.g., aluminum.

The covers can be finned as seen in FIG. 15 and/or fitted with heat pipes as seen in FIG. 16.

The covers can be formed, for example, from graphite composite.

Exemplary heat-dissipating components are discussed above.

In some embodiments, the ring frame includes multiple mounting methods; e.g., has one or more cable clamps and at has one or more mounting screw holes defined therein for attachment to a pedestal or wall. Advantageously, ring frames with multiple mounting methods permit use in a variety of applications (e.g., overhead cables, walls, and pedestals) so that multiple types of ring frames do not need to be kept in stock.

Furthermore, given the discussion thus far, and with continued attention to FIGS. 12-16, it will be appreciated that, in general terms, an exemplary electronic component housing apparatus, according to an aspect of the invention, includes a ring frame 1203, 1303 having first and second open sides and an electrical connector block 1259, 1359. Also included is at least one mount configured to attach the ring frame to an external mounting element (e.g., at least one cable clamp 1213 configured to secure the ring frame to an aerial cable 1211 as the external mounting element or at least one screw hole 1379 defined in the ring frame and configured to secure the ring frame to one of a pedestal and a building wall as the external mounting element, via at least one screw).

A plurality of power and signal cable connection points 1209, 1309 are defined on the ring frame.

First and second covers 1205/1305, 1207/1307 are securable to the ring frame. Each of the first and second covers is open on one side facing the ring frame and defines a mounting cavity.

A plurality of heat-dissipating electronic components are mechanically and thermally coupled to the first and second covers and located in the mounting cavities. The heat-dissipating electronic components are releasably electrically coupled to the electrical connector block.

In at least some embodiments, the ring frame is structurally robust and the first and second covers are optimized for at least one of weight, thermal conductivity, and radio frequency (RF) properties.

As noted above, the ring frame can be formed from, e.g., aluminum; the covers can be finned as seen in FIG. 15 and/or fitted with heat pipes as seen in FIG. 16; the covers can be formed, for example, from graphite composite; and/or the heat-dissipating components can include, for example, various components as discussed above.

In some cases, said at least one mount includes two or more different types of mounts; e.g., at least one cable clamp configured to secure said ring frame to an aerial cable as the external mounting element; and at least one screw hole defined in said ring frame and configured to secure said ring frame to one of a pedestal and a building wall as the external mounting element, via at least one screw.

Even further, given the discussion thus far, and still with attention to FIGS. 12-15, it will be appreciated that, in general terms, an exemplary method, according to an aspect of the invention, includes securing a ring frame 1203, 1303 to a mounting structure (e.g., cable 1211, wall, or pedestal). the ring frame has first and second open sides and has a plurality of power and signal cable connection points 1209, 1309 defined thereon. the ring frame has an electrical connector block 1259, 1359. A further step includes coupling a plurality of power and signal cables 1293, 1295 to the power and signal cable connection points and the electrical connector block. A still further step includes providing first and second covers 1205/1305, 1207/1307 for the ring frame. Each of the first and second covers is open on one side facing the ring frame and defines a mounting cavity.

Yet a further step includes mechanically and thermally coupling a plurality of heat-dissipating electronic components to the first and second covers in the mounting cavities. Still a further step includes releasably electrically coupling the heat-dissipating electronic components to the electrical connector block. An even further step includes securing the first and second covers to the ring frame.

In at least some embodiments, the ring frame is structurally robust and the first and second covers are optimized for at least one of weight, thermal conductivity, and radio frequency (RF) properties.

One or more embodiments further include performing at least one of maintenance and replacement on at least one of the heat-dissipating electronic components 1251, 1253, 1351, 1353 by removing at least one of the first and second covers 1205, 1207, 1305, 1307 (e.g., the cover containing the component of interest) to provide access to the at least one of the heat-dissipating electronic components and disconnecting the releasable electrical coupling of the at least one of the heat-dissipating electronic components to the electrical connector block 1259, 1359, while keeping the ring frame secured to the mounting structure and keeping the plurality of power and signal cables coupled to the power and signal cable connection points and the electrical connector block.

In some cases, in the step of securing the ring frame, the mounting structure includes an aerial cable 1211, and the securing includes securing the ring frame to the aerial cable with cable clamps 1213.

In some cases, in the step of securing the ring frame, the mounting structure includes one of a pedestal and a building wall, as per the embodiment of FIG. 13.

In some cases, in the step of securing the ring frame, the ring frame is formed from aluminum.

In some instances, in the step of providing the covers, the covers are finned and/or are formed from graphite composite and/or include heat pipes.

In some embodiments, in the step of mechanically and thermally coupling the plurality of heat-dissipating electronic components, the heat-dissipating components include one or more components as discussed above.

System and Article of Manufacture Details

The invention employs hardware but can be used within a network having a combination of hardware and software aspects. Software includes but is not limited to firmware, resident software, microcode, etc. An article of manufacture can include a machine-readable medium that contains one or more programs which when executed implement certain steps; that is to say, a computer program product including a tangible computer readable recordable storage medium (or multiple such media) with computer usable program code configured to implement certain steps indicated, when run on one or more processors. Furthermore, one or more embodiments of the invention or elements thereof employ hardware but can be implemented in a network employing an apparatus including a memory and at least one processor that is coupled to the memory and operative to perform, or facilitate performance of, certain steps.

Yet further, in another aspect, one or more embodiments of the invention or elements thereof can be implemented in the form of means for carrying out one or more of the method steps described herein.

Figure 7:
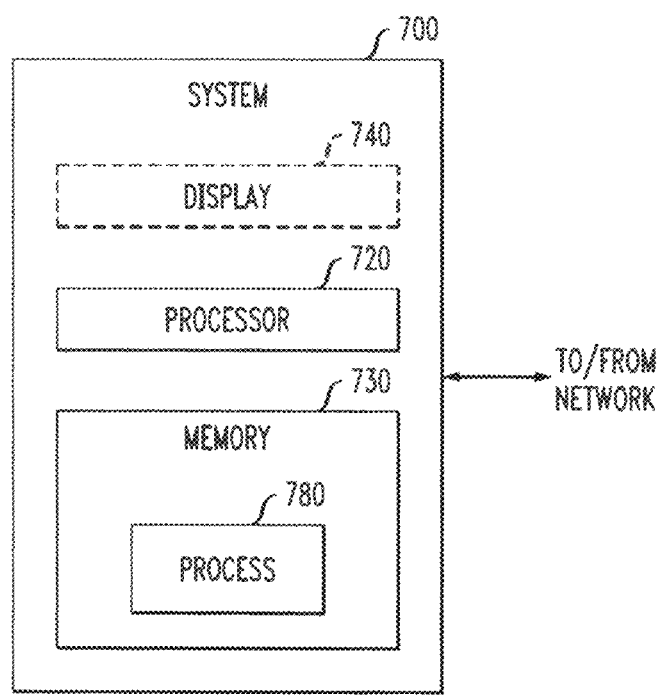
FIG. 7 is a block diagram of a computer system useful in connection with one or more overall systems discussed herein.

FIG. 7 is a block diagram of a system 700 that can be sued in a larger network employing node housing in accordance with aspects of the invention, and is representative, for example, of one or more of the servers shown in the figures. As shown in FIG. 7, memory 730 configures the processor 720 to implement one or more methods, steps, and functions (collectively, shown as process 780 in FIG. 7). The memory 730 could be distributed or local and the processor 720 could be distributed or singular. Different steps could be carried out by different processors.

The memory 730 could be implemented as an electrical, magnetic or optical memory, or any combination of these or other types of storage devices. It should be noted that if distributed processors are employed, each distributed processor that makes up processor 720 generally contains its own addressable memory space. It should also be noted that some or all of computer system 700 can be incorporated into an application-specific or general-use integrated circuit. For example, one or more steps could be implemented in hardware in an ASIC or via a field-programmable gate array (FPGA) rather than using firmware. Display 740 is representative of a variety of possible input/output devices (e.g., keyboards, mice, and the like). Every processor (e.g. those of pollers or servers) may not have a display, keyboard, mouse or the like associated with it.

As is known in the art, an article of manufacture can itself include a tangible computer readable recordable storage medium having computer readable code means embodied thereon. The computer readable program code means is operable, in conjunction with a computer system (including, for example, system 700 or the like), to carry out appropriate functionality. A computer readable medium may, in general, be a recordable medium (e.g., floppy disks, hard drives, compact disks, EEPROMs, or memory cards) or may be a transmission medium (e.g., a network including fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk. The medium can be distributed on multiple physical devices (or over multiple networks). As used herein, a tangible computer-readable recordable storage medium is defined to encompass a recordable medium, examples of which are set forth above, but is defined not to encompass a transmission medium or disembodied signal. Also, a "non-transitory computer readable medium" expressly excludes a transmission medium or disembodied signal.

The computer systems and servers and other pertinent elements described herein each typically contain a memory that will configure associated processors to implement appropriate functionality. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network. Furthermore, memory can include memory on the processor chip, volatile memory such as RAM coupled thereto, and non-volatile memory such as a non-transitory computer readable medium comprising computer executable instructions which when loaded into the RAM or on-chip memory configure the processor(s) to carry out appropriate functionality.

As used herein, unless it is unambiguously apparent from the context that only server software is being referred to, a "server" includes a physical data processing system (for example, system 700 as shown in FIG. 7) running one or more server programs. It will be understood that such a physical server may or may not include a display, keyboard, or other input/output components. Furthermore, as used herein, including the claims, a "router" includes a network-ing device with both software and hardware tailored to the tasks of routing and forwarding information.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An assembly comprising:
 a ring frame having first and second open sides and an electrical connector block;
 a mounting structure to which said ring frame is secured;
 a plurality of power and signal cable connection points defined on said ring frame;
 a plurality of power and signal cables coupled to said power and signal cable connection points and said connector block;
 first and second covers secured to said ring frame, each of said first and second covers being open on one side facing said ring frame and defining a mounting cavity; and
 a plurality of heat-dissipating electronic components mechanically and thermally coupled to said first and second covers and located in said mounting cavities, said heat-dissipating electronic components being releasable electrically coupled to said electrical connector block.

2. The assembly of claim 1, wherein said mounting structure comprises an aerial cable, further comprising cable clamps securing said ring frame to said aerial cable.

3. The assembly of claim 1, wherein said mounting structure comprises one of a pedestal and a building wall.

4. The assembly of claim 1, wherein said ring frame is formed from aluminum.

5. The assembly of claim 1, wherein said first and second covers are provided with at least one of fins or heat pipes.

6. The assembly of claim 5, wherein said first and second covers are formed from graphite composite.

7. The assembly of claim 5, wherein said first and second covers are provided with said heat pipes, and wherein said heat pipes are oriented horizontally.

8. The assembly of claim 1, wherein said heat-dissipating components comprise at least one of power supplies; hybrid fiber cable/radio frequency amplifiers; data over cable service interface specification modules; passive optical network modules; Ethernet over passive optical network modules; wireless local area network modules; small cell fifth generation modules; optical switch modules; Ethernet aggregation modules; or lump compute modules.

9. The assembly of claim 1, wherein said ring frame includes cable clamps and at has at least one mounting screw hole defined therein.

10. An electronic component housing apparatus comprising:
- a ring frame having first and second open sides and an electrical connector block;
- at least one mount configured to attach said ring frame to an external mounting element;
- a plurality of power and signal cable connection points defined on said ring frame;
- first and second covers securable to said ring frame, each of said first and second covers being open on one side facing said ring frame and defining a mounting cavity; and
- a plurality of heat-dissipating electronic components mechanically and thermally coupled to said first and second covers and located in said mounting cavities, said heat-dissipating electronic components being releasable electrically coupled to said electrical connector block.

11. The apparatus of claim 10, wherein said at least one mount comprises at least one cable clamp configured to secure said ring frame to an aerial cable as the external mounting element.

12. The apparatus of claim 10, wherein said at least one mount comprises at least one screw hole defined in said ring frame and configured to secure said ring frame to one of a pedestal and a building wall as the external mounting element, via at least one screw.

13. The apparatus of claim 10, wherein said ring frame is formed from aluminum.

14. The apparatus of claim 10, wherein said first and second covers are provided with at least one of fins or heat pipes.

15. The apparatus of claim 14, wherein said first and second covers are formed from graphite composite.

16. The apparatus of claim 14, wherein said first and second covers are provided with said heat pipes, and wherein said heat pipes are oriented horizontally.

17. The apparatus of claim 10, wherein said heat-dissipating components comprise at least one of power supplies; hybrid fiber cable/radio frequency amplifiers; data over cable service interface specification modules; passive optical network modules; Ethernet over passive optical network modules; wireless local area network modules; small cell fifth generation modules; optical switch modules; Ethernet aggregation modules; or lump compute modules.

18. The apparatus of claim 10, wherein said at least one mount comprises both:
- at least one cable clamp configured to secure said ring frame to an aerial cable as the external mounting element; and
- at least one screw hole defined in said ring frame and configured to secure said ring frame to one of a pedestal and a building wall as the external mounting element, via at least one screw.

19. A method comprising:
- securing a ring frame to a mounting structure, said ring frame having first and second open sides and having a plurality of power and signal cable connection points defined thereon, said ring frame having an electrical connector block;
- coupling a plurality of power and signal cables to said power and signal cable connection points and said electrical connector block;
- providing first and second covers for said ring frame, each of said first and second covers being open on one side facing said ring frame and defining a mounting cavity;
- mechanically and thermally coupling a plurality of heat-dissipating electronic components to said first and second covers in said mounting cavities;
- releasably electrically coupling said heat-dissipating electronic components to said electrical connector block; and
- securing said first and second covers to said ring frame.

20. The method of claim 19, further comprising performing at least one of maintenance or replacement on at least one of said heat-dissipating electronic components by removing at least one of said first cover or said second cover to provide access to said at least one of said heat-dissipating electronic components and disconnecting said releasable electrical coupling of said at least one of said heat-dissipating electronic components to said electrical connector block, while keeping said ring frame secured to said mounting structure and keeping said plurality of power and signal cables coupled to said power and signal cable connection points and said electrical connector block.

21. The method of claim 19, wherein, in said step of securing said ring frame, said mounting structure comprises an aerial cable, wherein said securing comprises securing said ring frame to said aerial cable with cable clamps.

22. The method of claim 19, wherein, in said step of securing said ring frame, said mounting structure comprises one of a pedestal and a building wall.

23. The method of claim 19, wherein, in said step of securing said ring frame, said ring frame is formed from aluminum.

24. The method of claim 19, wherein, in said step of providing said first and second covers, said first and second covers are provided with at least one of fins or heat pipes.

25. The method of claim 24, wherein, in said step of providing said first and second covers, said first and second covers are formed from graphite composite.

26. The method of claim 24, wherein, in said step of providing said first and second covers, said first and second covers are provided with said heat pipes, and wherein said heat pipes are oriented horizontally.

27. The method of claim 19, wherein, in said step of mechanically and thermally coupling said plurality of heat-dissipating electronic components, said heat-dissipating components comprise at least one of power supplies; hybrid fiber cable/radio frequency amplifiers; data over cable service interface specification modules; passive optical network modules; Ethernet over passive optical network modules; Wi Fi wireless local area network modules; small cell fifth generation modules; optical switch modules; Ethernet aggregation modules; or lump compute modules.

* * * * *